United States Patent [19]
Yamazaki

[11] Patent Number: 4,470,060
[45] Date of Patent: Sep. 4, 1984

[54] LIQUID CRYSTAL DISPLAY WITH VERTICAL NON-SINGLE CRYSTAL SEMICONDUCTOR FIELD EFFECT TRANSISTORS

[75] Inventor: Shunpei Yamazaki, Tokyo, Japan

[73] Assignee: Semiconductor Energy Laboratory Co., Ltd., Tokyo, Japan

[21] Appl. No.: 338,658

[22] Filed: Jan. 11, 1982

[30] Foreign Application Priority Data

| Jan. 9, 1981 | [JP] | Japan | 56-1767 |
| Jan. 9, 1981 | [JP] | Japan | 56-1768 |
| Oct. 29, 1981 | [JP] | Japan | 56-174120 |

[51] Int. Cl.³ ............... H01L 27/02; H01L 29/78; H01L 49/02; H01L 27/10
[52] U.S. Cl. .................... 357/41; 357/4; 357/23.4; 357/23.7; 357/45; 350/334
[58] Field of Search ............ 357/23 TF, 23 VD, 4, 357/41, 45; 350/333, 334, 336

[56] References Cited

U.S. PATENT DOCUMENTS

| 4,024,626 | 5/1977 | Leupp et al. | 357/45 |
| 4,094,582 | 6/1978 | Goodman | 357/23 TF |
| 4,204,217 | 5/1980 | Goodman | 357/23 TF |
| 4,409,724 | 10/1983 | Tasch et al. | 357/41 |
| 4,431,271 | 2/1984 | Okubo | 357/23 TF |

FOREIGN PATENT DOCUMENTS 54-140878 11/1979 Japan ............... 357/23 TF

OTHER PUBLICATIONS

Drangeid, "High-Speed Field-Effect Structure", IBM Technical Disclosure Bulletin, vol. 11, (8/68), pp. 332-333.

Le Comber et al., "Amorphous-Silicon Field-Effect Device . . . ", Electronics Letters, vol. 15, (Mar. 15, 1979), pp. 179-181.

Hayama et al., "Amorphous-Silicon Thin-Film Metal-Oxide-Semiconductor Transistors", Appl. Phys. Lett. 39, (May 1, 1980), pp. 754-755.

Primary Examiner—Gene M. Munson
Attorney, Agent, or Firm—Gerald J. Ferguson, Jr.; Joseph J. Baker

[57] ABSTRACT

Apparatus is provided with at least a FET. The FET is formed of a first semiconductor layer formed on a substrate, a second semiconductor layer formed on the first semiconductor layer, a insulating layer extending on the side surface of the second semiconductor layer and a conductive layer extending on the insulating layer in opposing relation to the side surface of the second semiconductor layer. In this case, the first, second and third semiconductor layers are formed of a non-single crystal semiconductor doped with a dangling bond neutralizer. The first and third semiconductor layers have the same conductivity type. The second semiconductor layer has a higher resistivity than the first and third semiconductor layers.

The first and third semiconductor layers serve as either one of the drain and source and the other of them, respectively. The second semiconductor layer serves as channel region. The insulating layer and the conductive layer serve as gate insulating layer and gate electrode, respectively.

28 Claims, 42 Drawing Figures

4,470,060

LIQUID CRYSTAL DISPLAY WITH VERTICAL NON-SINGLE CRYSTAL SEMICONDUCTOR FIELD EFFECT TRANSISTORS

BACKGROUND OF THE INVENTION

1. Field of the Invention

The present invention relates to apparatus provided with a field effect transistor (hereinafter referred to as an FET) or FETs.

2. Description of the Prior Art

Heretofore there have been proposed a variety of apparatus having an FET or FETs constituted using non-single crystal semiconductor layers, in particular, amorphous semiconductor layers.

The amorphous semiconductor layer can be easily formed on a required substrate at a temperature lower than in the case of forming a single crystal semiconductor layer. Accordingly, an FET employing the amorphous semiconductor layers can be manufactured with more ease than in the case of producing an FET using the single crystal semiconductor layers.

In the conventional FET utilizing the amorphous semiconductors, however, amorphous semiconductor layers constituting the source and drain, respectively, and a semiamorphous semiconductor layer forming the channel region are usually arranged on the substrate in a direction of its plane. For this reason, the length of the channel region, i.e. the channel length between the source and drain depends on the length of the amorphous semiconductor layer in the direction of the plane of the substrate forming the channel region between the amorphous semiconductor layers forming the source and drain, respectively. The channel length can be reduced by forming the amorphous semiconductor layers so that the length of the former layer may be small in the direction of its plane between the latter layers, or that the distance may be small between the opposing sides surfaces of the latter layers. However, there is a certain limit to the formation of the amorphous semiconductor layer or layers so that the channel length may be sufficiently small.

For the abovesaid reason, the prior art FET employing the amorphous semiconductor layers has the defects of limitations on obtaining the FET function with high efficiency at high speed, the necessity of using a bias power source which produces a high voltage, etc.

Furtheremore, there has heretofore been attempted to obtain, for example, electrical picture information from an input optical image by the use of apparatus in which a lot of FETs employing the amorphous semiconductor are arranged in a matrix form. But the conventional apparatus possesss the shortcomings that they are complex and bulky and very difficult to manufacture.

There has also been attempted in the past to obtain, for instance, a memory circuit using apparatus in which a number of FETs employing the amorphous semiconductor layers, each having connected thereto a capacitance element for storage use, are arranged in a matrix form. But these apparatus also have the same drawbacks as mentioned above.

SUMMARY OF THE INVENTION

It is therefore an object of the present invention to provide novel apparatus which is provided with an FET or FETs formed using a non-single crystal semiconductor layers and which is free from the abovesaid defects of the prior art.

According to an aspect of the present invention, non-single crystal semiconductor layers constituting the source, drain and channel region of the FET, respectively, are formed one or another on the substrate. Therefore, the channel length depends on the thickness of the non-single crystal semiconductor layer forming the channel region. The non-single crystal semiconductor layer can be easily formed sufficiently thin; hence, the channel length can be made far smaller than in the conventional FET.

Accordingly, the FET of the apparatus of the present invention has the advantages that the FET function can be performed with high efficiency at high speed, and that a lower bias voltage source can be employed.

According to another aspect of the present invention, the apparatus has such an arrangement that a number of FETs formed using the non-single crystal semiconductor layers are arranged in a matrix form for obtaining, for instance, electrical picture information from an optical image. The apparatus is very simple in structure, and hence it can be easily formed small in size.

According to another aspect of the present invention, the apparatus has such an arrangement that a number of FETs formed using the non-single crystal semiconductor, each having connected thereto a capacitance element for storage use, are arranged in a matrix form, for instance, for obtaining a memory circuit. The apparatus is very simple in structure, and hence it can be easily formed small in size.

According to still another aspect of the present invention, the apparatus has such an arrangement that a number of FETs formed using the non-single crystal semiconductor, each having connected thereto a liquid crystal element, are arranged in a matrix form for providing an image display, for instance. The apparatus is very simple in structure, and hence it can be easily formed small in size.

Other objects, features and advantages of the present invention will become more apparent from the following description taken in conjunction with the accompanying drawings.

DESCRIPTION OF THE PREFERRED EMBODIMENTS

Figure 1:
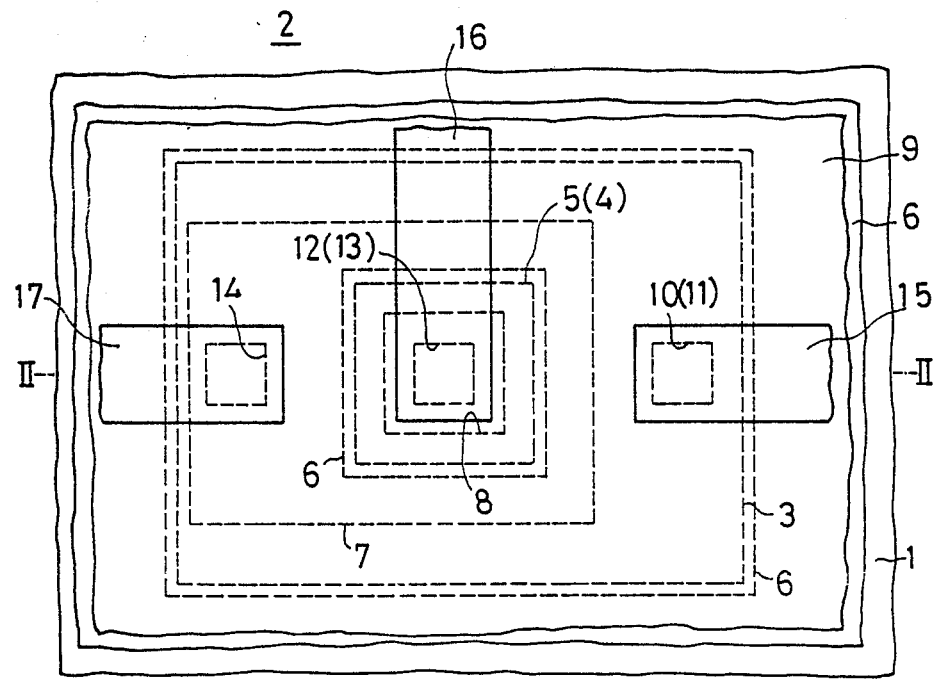
FIG. 1 is a plan view schematically illustrating a first embodiment of the apparatus of the present invention.
Figure 2:
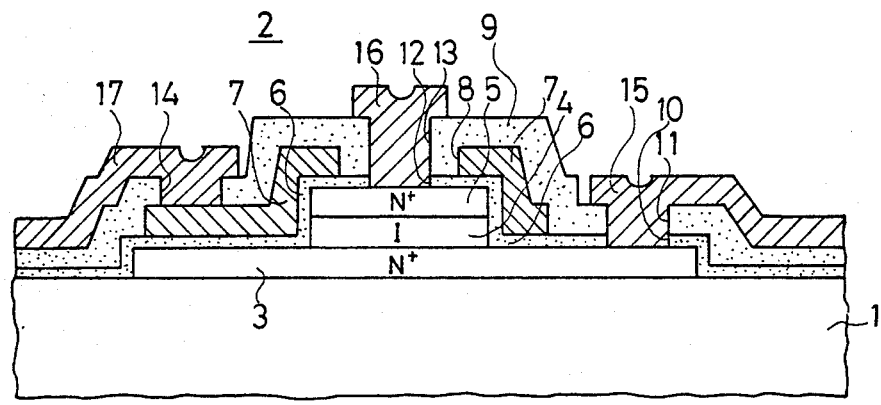
FIG. 2 is a sectional view taken on the line II—II in FIG. 1.

FIGS. 1 and 2 illustrate a first embodiment of the apparatus of the present invention, which has at least one FET 2 constituted on an insulating or semi-insulating substrate 1.

The FET 2 has semiconductor layers 3, 4 and 5 laminated in this order on the substrate 1.

In this case, the semiconductor layers 3, 4 and 5 are each formed of a non-single crystal semiconductor doped with a dangling bond neutralizer, in particular, an amorphous or semi-amorphous semiconductor doped with the dangling bond neutralizer. The semiamorphous semiconductor has such a structure that the degree of crystallization varies spatially, and it is composed of a mixture of a microcrystalline semiconductor and a noncrystalline semiconductor. The mixture is doped with a dangling bond neutralizer and the microcrystalline semiconductor has a lattice strain. The microcrystalline semiconductor typically has a particle size of 5 to 500 Å, in particular, 5 to 200 Å and is dispersed in the noncrystalline semiconductor. The dangling bond neutralizer is less than 5 mol % with regard to the mixture. Such a semiamorphous semiconductor can be obtained by the low-temperature, low-pressure chemical vapor deposition method (commonly referred to as a low-temperature, low-pressure CVD method) described in detail in my prior U.S. patent application Ser. No. 177,889 filed on Aug. 14, 1981. It is preferable that the amorphous semiconductor be amorphous silicon, and that the dangling bond meutralizer be hydrogen, or a halogen such fluorine or chlorine.

The semiconductor layers 3 and 5 have the same conductivity type, for instance, N+ type. The semiconductor layer 4 has a higher resistivity than do the semiconductor layers 3 and 5 and it is, for example, I type (undoped or compensated and hence intrinsic).

The semiconductor layer 3 has an island-like pattern. The semiconductor layers 4 and 5 are smaller in area than the semiconductor layer 3 and they are of the same pattern and size and formed exactly one on the other. The semiconductor layers 3, 4 and 5 can be formed in the manner such, for example, as follows: At first, first, second and third semiconductor layers which will ultimately constitute the semiconductor layers 3, 4 and 5 are formed in this order over the entire area of the top surface of the substrate 1. Then, the second and third semiconductor layers are selectively etched away using a first mask to form the semiconductor layers 4 and 5. Following this, the first semiconductor layer is selectively etched away using a second mask, obtaining the semiconductor layer 3. Alternatively, the first semiconductor layer is formed over the entire area of the substrate surface and then selectively etched away using the abovesaid second mask to obtain the semiconductor layer 3. Next, the second and third semicondcutor layers are formed in this order on the substrate 1 to cover the entire area of the exposed surface of the semiconductor layer 3 and selectively etched away through the abovesaid first mask, obtaining the semiconductor layers 4 and 5.

The FET 2 further has an insulating layer 6 which covers the entire area of the side surface of the semiconductor layer 4. The insulating layer 6 further extends over the entire areas of the top and side surfaces of the semiconductor layer 5 and the entire areas of the side surface and the top surface of the semiconductor layer 3 except the area where the semiconductor layers 4 and 5 are formed. The insulating layer 6 may be a silicon nitride layer which is formed by the low-pressue CVD method or a phosphorus glass layer which is formed by the low-pressure CVD method, but it may also be an oxide layer which is formed by oxidation of the external surfaces of the semiconductor layers 3, 4 and 5.

The FET 2 further includes a conductive layer 7 that covers the insulating layer 6 in opposing relation to the entire area of the side surface of the semiconductor layer 4 and the entire areas of the top and side surfaces of the semiconductor layer 5 and the top surface of the semiconductor layer 3. The conductive layer 7 has formed therein a window 8 opposite the top surface of the semiconductor layer 5. The conductive layer 7 may be a non-single crystal semiconductor layer as of polycrystalline, amorphous or semiamorphous silicon, which is of the same conductivity type as the semiconductor layers 3 and 5, a metal layer as of molybdenum, or a laminated layer consisting of the non-single crystal semiconductor layer and the metal layer.

Moreover, there is formed on the substrate 1 an interlayer insualting layer 9 that extends over the conductive layer 7 and the insulating layer 6 excepts that area where the conductive layer 7 is formed. The insulating layer 9 may be a synthetic resin layer as of polyimid or a silicon oxide layer.

The insulating layers 6 and 9 have made therein windows 10 and 11 to expose therethrough the semiconductor layer 3 to the outside and windows 12 and 13 to expose therethrough the semiconductor layer 5 to the outside. Furthermore, the insulating layer 9 has another window 14 through which the conductive layer 7 is exposed to the outside.

On the insulating layer 9 are formed a stripe-like conductive layer 15 connected with the semiconductor layer 3 through the windows 10 and 11, another strip-like conductive layer 16 connected with the semiconductor layer 5 through the windows 12 and 13 and still another strip-like conductive layer 17 connected with the conductive layer 7 through the window 14.

The above is a description of the construction of the first embodiment of the apparatus according to the present invention. With the arrangement described above, when a required control power source is connected between the conductive layer 15 or 16 and the conductive layer 17 in such a state in which a required bias power source is connected between the conductive layers 15 and 16 via a load, since the conductive layer 17 is coupled with the conductive layer 7 formed on the side surface of the semiconductor layer 4 through the insulating layer 6, a channel is set up on the side surface of the semiconductor layer 4 between the semiconductor layers 3 and 5, permitting a power supply from the bias power source to the load via the conductive layers 15 and 16.

Figure 4:
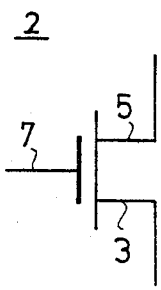
FIG. 4 is a diagram schematically showing an FET that each of the apparatus of FIGS. 1, 2 and 3 has.

Accordingly, the FET 2 of the apparatus of the present invention performs the function of an insualted gate FET which employs either one of the semiconductor layers 3 and 4 as a source and the other as a drain and utilizes the semiconductor layer 4 as a channel region, the conductive layer 7 as a gate electrode, the insulating layer 6 as a gate insulating layer, and either the conductive layer 15 or 16 (depending on whether the semiconductor layer 3 or 5 is used as the source) as a source lead and the other as a drain lead. For this reason, the FET 2 is represented as an ordinary insulated gate FET as illustrated in FIG. 4.

In such an FET 2, as the semiconductor layers 3, 4 and 5 on the substrate 1 are formed of a non-single crystal semiconductor, they can be easily obtained at a temperature between 200° to 300° C. which is far lower than in the case of forming a semcionductor layer of a single crystal semiconductor. Therefore, the substrate 1 need not be made of an expensive material which well withstands high temperatures and has a small coefficient of thermal expansion; that is, the substrate 1 may be a light transparent one formed, for instance, of a soda glass which is inexpensive and readily available. When such a light transparent substrate 1 is employed, light can be entered into the semiconductor layer 4 via the substrate 1 and the semiconductor layer 3 from the outside of the substrate 1. Consequently, in the case where the bias power source is connected between the conductive layers 15 and 16 via the load, it is possible to supply the load with a power corresponding to the quantity of incident light.

Since the semiconductor layers 3, 4 and 5 are sequentially laminated in this order on the substrate 1 as referred to previously, it is possible that any one of the semiconductor layers 3, 4 and 5 is formed of a material different from that for one of the two other layers, and that any one of the semiconductor layers 3, 4 and 5 is given an energy band gap different from that of one of the two other layers. For example, the semiconductor layer 3 can be made to have a larger energy band gap than does the semicondcutor layer 4. Also it is possible to form any one of the semiconductor layers 3, 4 and 5 so that its energy band gap may continuously vary, or to form the semiconductor layers 3 and 4, 4 and 5 or 3, 4 and 5 so that their combined energy band gap may vary continuously as a whole. For example, the energy band gap of the semiconductor layer 3 can be made to gradually decrease towards the semiconductor layer 4 from the side of the substrate 1 and the energy band gap of the semiconductor layer 4 can be made equal to the energy band gap of the semiconductor layer 3 on the side of the layer 4, throughout the direction of its thickness. Accordingly, in the case of entering light into the semiconductor layer 4 through the substrate 1 and the semiconductor layer 3 as mentioned previously, it is possible to make the semiconductor layers 3 and 4 have appropriate energy band gaps corresponding to the wavelength of the incident light. Therefore, the light can be efficiently entered into the semiconductor layer 4.

With the FET 2 of the apparatus of the present invention, when the semiconductor layer 3 is made P type (or N type), the function of an FET is obtained by virture of the action of holes (or electrons) flowing towards the semicondcutor layer 3 from the side of the semiconductor layer 4. In this case, electrons (or holes) flow towards the semiconductor layer 4 from the side of the semiconductor layer 3. These electrons (or holes) are undesirable for obtaining the function of the FET. But, in the FET 2, the energy band gap of the semiconductor layer 3 can be made larger than the energy band gap of the semiconductor layer 4 as described above, so that a barrier can be set up between the semiconductor layers 3 and 4 for the electrons (or holes) that tend to flow towards the semiconductor layer 3 from the layer 4. Consequently, the FET 2 of the present invention is capable of efficiently serving as an FET.

Besides, in the FET 2 of the apparatus of the present invention, since the semiconductor layers 3, 4 and 5 are sequentially formed, either one or both of the semiconductor layers 3 and 5 can be formed of a material doped with an element by which their resistivity can be controlled. For instance, by forming the semiconductor layer 3 or 5 of a material doped with 10 to 30 mol % of oxyten, it is possible to reduce an undesired over current which occurs when a bias of a voltage higher than a predetermined one has been applied across the conductive layers 15 and 16. Furthermore, as the semiconductor layers 3, 4 and 5 are sequentially formed, excellent N+I or P+I junctions can be established between the semiconductor layers 3 and 4 and between 4 and 5, ensuring that the FET 2 performs as an FET with excellent characteristics. In the FET 2, the semiconductor layer 4 serves as a channel region. The thickness of the semiconductor layer 4 determines the channel length between the semiconductor layers 3 and 5. The semiconductor layer 4 can be easily made thin and consequently the channel length can be made sufficiently small. Therefore, the function of the FET can be efficiently obtained at high speed. In addition, the bias power source which is connected across the conductive layers 15 and 16 need not be a high-voltage source; for example, the bias power source may be one that provides a voltage lower than 10 V.

Figure 3:
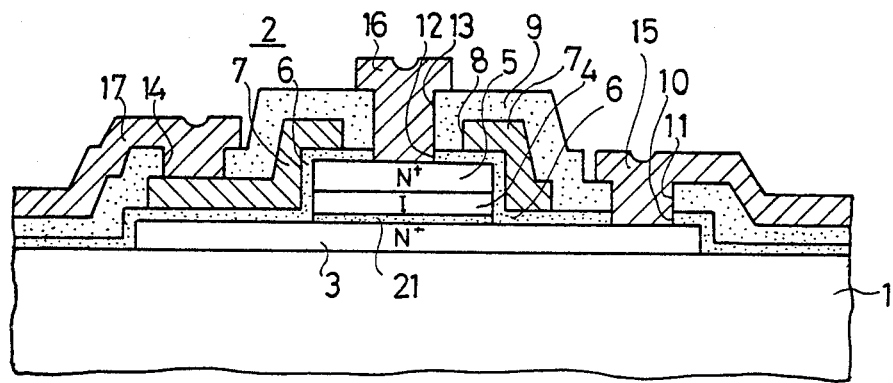
FIG. 3 is a sectional view schematically illustrating a second embodiment of the present invention.

Next, a description will be given, with reference to FIG. 3, of a second embodiment of the present invention. In FIG. 3, the parts corresponding to those in FIGS. 1 and 2 are identified by the same reference numerals and no detailed description will be repeated. The second embodiment is identical in construction with the first embodiment of FIGS. 1 and 2 except that there is interposed between the semiconductor layers 3 and 4 an insulating or semi-insulating layer 21 which has a thickness (for instance, 10 to 40 Å) small enough to permit the passage therethrough of a tunnel current. The insulating or semiinsulating layer 21 may be formed of silicon nitride.

The above is a description of the second embodiment of the present invention. In the FET 2 of the apparatus shown in FIG. 3, the insulating or semi-insulating layer 21 permits the passage therethrough of current.

Accordingly, the FET 2 in the second embodiment of FIG. 3 performs the function of an FET as is the case with the FET 2 in the first embodiment of FIGS. 1 and 2. And the FET 2 also exhibits the excellent electric and photoelectric characteristics described previously with regard to FIGS. 1 and 2. With the provision of the insulating or semi-insulating layer 21, it is possible to reduce an undesired over current which occurs when a bias of a voltage higher than a predetermined one has been provided across the conductive layers 15 and 16.

Figure 5:
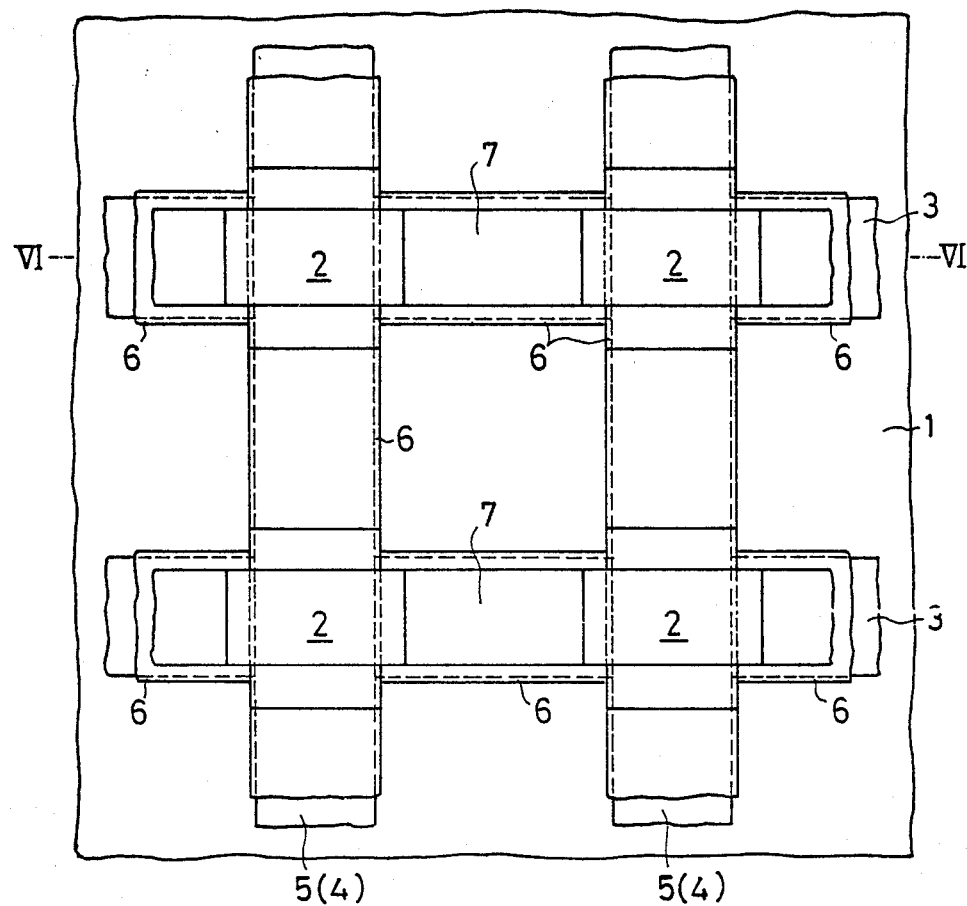
FIG. 5 is a plan view schematically illustrating a third embodiment of the present invention.
Figure 6:
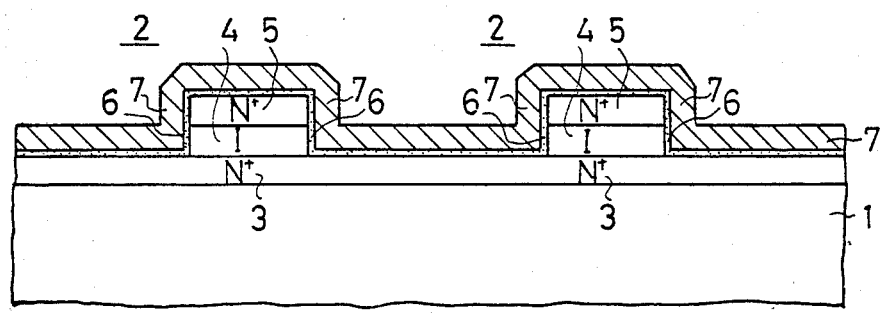
FIG. 6 is a sectional view taken on the line VI—VI in FIG. 5.

FIGS. 5 and 6 illustrates a third embodiment of the present invention. In FIGS. 5 and 6 the parts corresponding to those in FIGS. 1 and 2 are identified by the same reference numerals. In the third embodiment a plurality of semiconductor layers 3 similar to that used in FIGS. 1 and 2 are formed in parallel to extend in a lateral direction on the substrate 1 similar to that employed in FIGS. 1 and 2. A plurality of semiconductor layers 4 similar to that utilized in FIGS. 1 and 2 are formed in parallel to extend across the plurality of semiconductor layers 3 in a vertical direction. Furthermore, a plurality of semiconductor layers 5 similar to that used in the first embodiment are formed in the same strip-like pattern lying one on another. The same insualting layer 6 as that utilized in the first embodiment covers the entire side surfaces of the semiconductor layers 4 and the exposed areas of the semiconductor layers 3, 4 and 5. A plurality of conductive layers 7 similar to that employed in the first embodiment are formed in a stripe-like pattern to extend on the insulating layer 6 in the lateral direction. In this case, each conductive layer 7, as viewed from above, extends passing through the positions of intersection of one semiconductor layer 3 with a plurality of pairs of the semiconductor layer 4 and the overlying semiconductor layer 5. Consequently, each conductive layer 7 confronts the opposite sides of the plurality of semiconductor layers 4 through the insulating layer 6.

Figure 7:
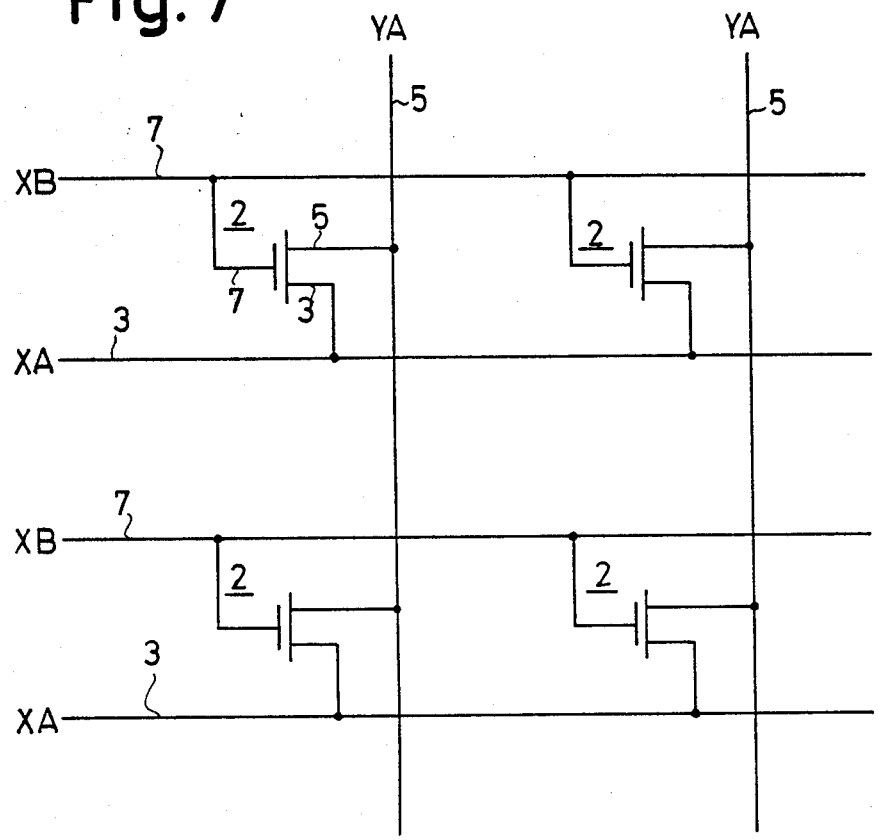
FIG. 7 is an equivalent circuit diagram of the apparatus of the third embodiment.

The above is the arrangement of the third embodiment of the present invention. With such an arrangement as described above, there is constituted at the position of intersection of each seconductor layer 3 with the plurality of pairs of the semiconductor layers 4 and 5 a plurality of insulated gate FETs 2 each of which employs either one of the semiconductor layers 3 and 5 as the source and the other as the drain, the semiconductor layer 4 as the channel region, the conductive layer 7 as the gate electrode and the insulating layer 6 as the gate insulating layer, as is the case with the first embodiment of FIGS. 1 and 2. The plurality of FETs 2 constituted in the direction of extension of each semiconductor layer 3 are interconnected at the source or drain via the semiconductor layer 3 and their gates are interconnected via the conductive layer 7. The plurality of FETs 2 set up in the direction of extension of each of the semiconductor layers 4 and 5 are interconnected at the other of the source and drain. Thus the third embodiment has such an structure as illustrated in FIG. 7 in which the FETs are arranged and connected in a matrix form.

According to the third embodiment described above in respect of FIGS. 5 and 6, by connecting each semiconductor layer 3 to one of row lines XA, each conductive layer 7 to one of the other row lines XB, each semiconductor layer 5 to one of column lines YA, a required bias power source across a selected one of the row lines XA and a selected one of the column lines YA via a load, and a control power source across the selected row line XA and a corresponding one of the other row lines XB, it is possible to obtain such a function that only one FET 2 at the intersection of the selected row line XA or XB and the selected column line YA can be selectively operated. Accordingly, in the case where a transparent substrate is used as the substrate 1 as described previously in connection with FIGS. 1 and 2 and an optical image is projected on the matrix arrangement of the plurality of FET 2, electrical picture information representing the optical image can be obtained. In this case, the electrical picture information can be obtained as a time series information by selecting the column lines YA one by one in a sequential order upon each selection of a pair of corresponding ones of the row lines XA and XB.

According to the third embodiment described above, it is possible to obtain the abovesaid function and operational effect with a very simple arrangement.

Figure 8:
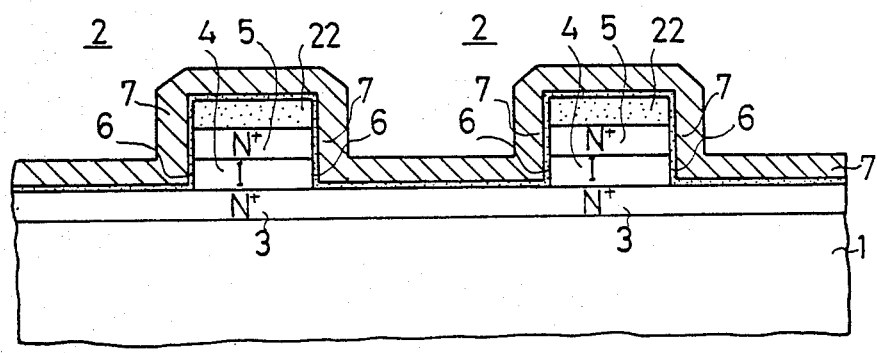
FIG. 8 is a sectional view schematically showing a fourth embodiment of the present invention.

FIG. 8 illustrates a fourth embodiment of the present invention, in which the parts corresponding to those in FIGS. 5 and 6 are identified by the same reference numerals. This embodiment is identical in construction with the third embodiment of FIGS. 5 and 6 except that an insulating layer 22, which is far thicker than the insulating layer 6, is interposed between the upper surface of each semiconductor layer 5 and the insulating layer 6.

With such an arrangement, a number of FETs are arranged in a matrix form as shown in FIG. 7 as in the case of the third embodiment. In this case, however, since the conductive layer 7 forming the gate electrode of each FET extends on the semiconductor layer 5, through an extension of the insulating layer 6 forming the gate insulating layer and the insulating layer 22 provided in this embodiment, the electrostatic capacitance between the extension of the conductive layer 7 and the semiconductor layer 5 is smaller than in the case of the third embodiment. This means that the electrostatic capacitance between the gate electrode and the source or drain is smaller than in the case of the third embodiment. Consequently, the fourth embodiment possesses the advantage that the same function of each FET as described previously in respect of the third embodiment can be obtained at higher speed than in the case of the third embodiment.

Figure 9:
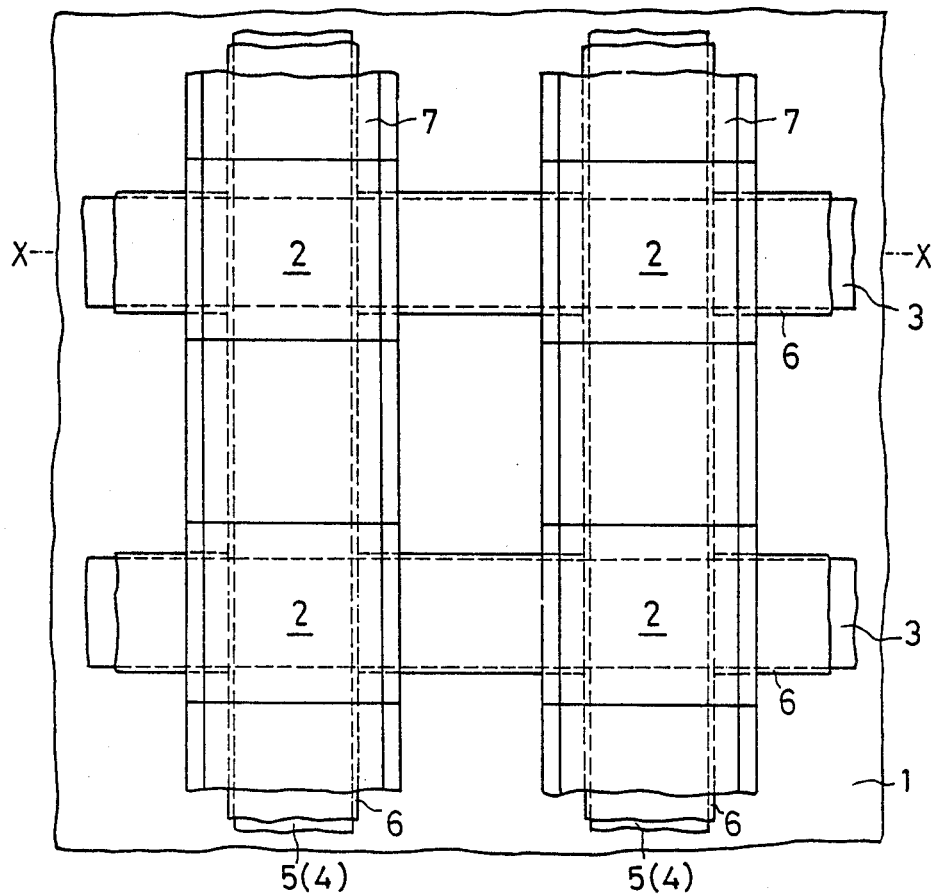
FIG. 9 is a plan view schematically showing a fifth embodiment of the present invention.
Figure 10:
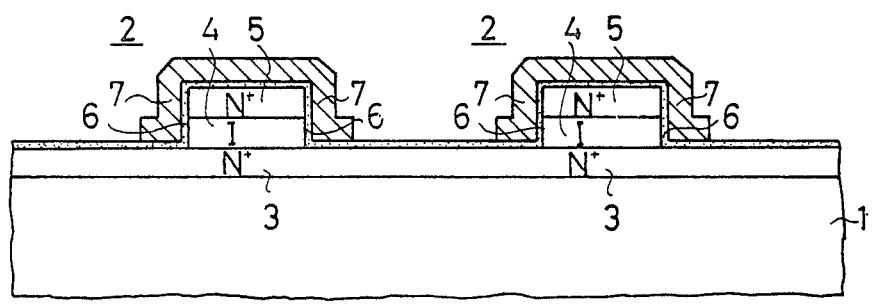
FIG. 10 is a sectional view taken on the line X—X in FIG. 9.

FIGS. 9 and 10 illustrate a fifth embodiment of the present invention, in which the parts corresponding to those in FIGS. 5 and 6 are indicated by the same reference numerals and no detailed description will be repeated. This embodiment is identical in construction with the embodiment of FIGS. 5 and 6 except that the plurality of conductive layers 7 extend in a vertical direction instead of in the lateral direction. In this case, however, each conductive layer 7 extends to entirely cover one pair of the semiconductor layer 4 and the overlying semiconductor layer 5. Accordingly, each conductive layer 7 lies opposite the two opposite side surfaces of one semiconductor layer 4 through the insulating layer 6.

Figure 11:
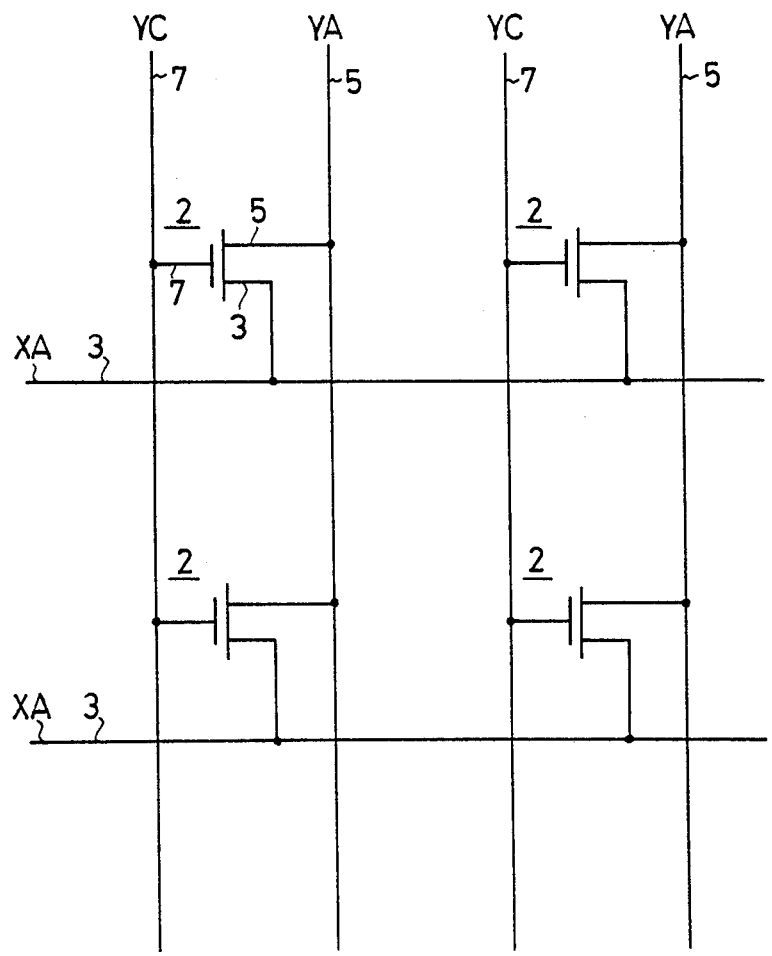
FIG. 11 is an equivalent circuit diagram of the apparatus of the fifth embodiment.

With such an arrangement, a plurality of insulated gate FETs are constituted at the intersection of each semiconductor layer 3 with a plurality of pairs of the semiconductor layer 4 and the overlying semiconductor layer 5 as is the case with the third embodiment shown in FIGS. 5 and 6. The plurality of FETs 2 arranged in the direction of extension of each semiconductor layer 3 are interconnected at either one of the source and drain via the semiconductor layer 3 as in the case of the third embodiment. The plurality of FETs 2 arranged in the direction of extension of the pair of the semiconductor layers 4 and 5 are interconnected at the gate via the conductive layer 7 and at the other of the source and drain via the semiconductor layer 5. Thus the FETs 2 are arranged in a matrix form as illustrated in FIG. 11. Consequently, according to the fifth embodiment of FIGS. 9 and 10, by connecting each semiconductor layer 3 to one of the row lines XA, each semiconductor layer 5 to one of the column lines YA and each conductive layer 7 to one of column lines YC, connecting a required bias power source across a selected one of the row lines XA and a selected one of the column lines YA via a load and connecting a control power source across the selected row line XA and one column line YC forming a counterpart to the selected column line YA, as in the case of the third embodiment, it is possible to obtain such a function that only one FET at the intersection of the selected row line XA with the pair of selected column lines YA and YC can selectively be activated. Therefore, it is possible to obtain electrical picture information from an optical input image and obtain the information as time series information, as described previously with respect to the third embodiment.

According to the fifth embodiment, the abovesaid function and operational effect can be obtained through the very simple structure shown in FIGS. 9 and 10.

Figure 12:
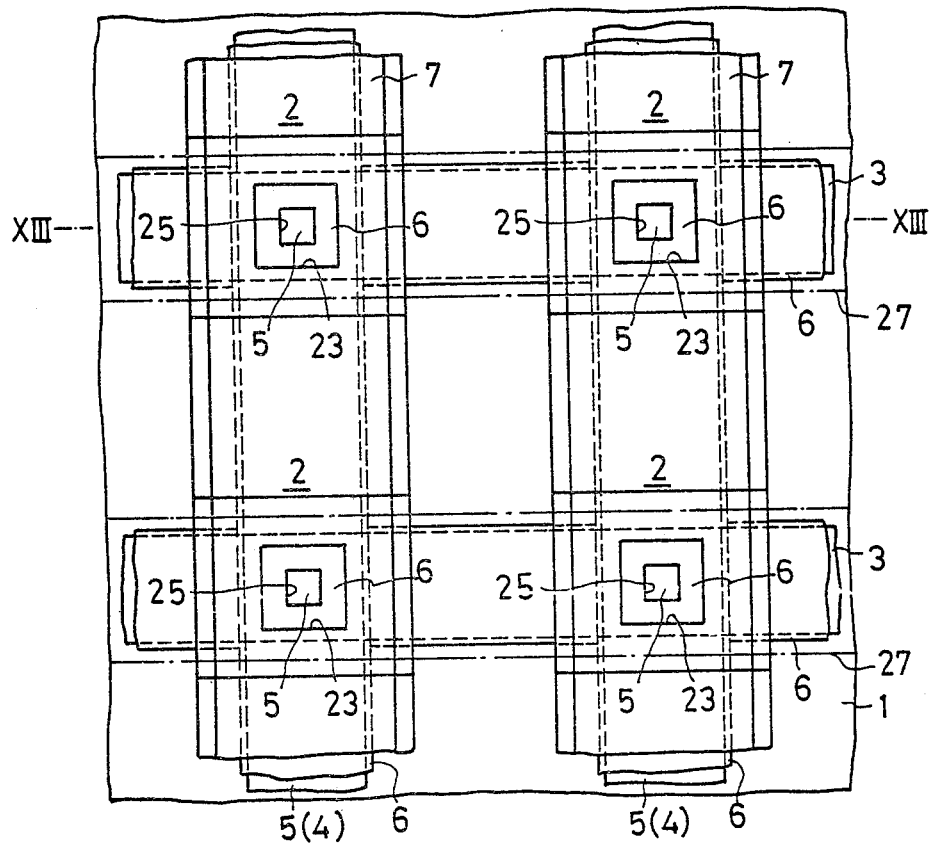
FIGS. 12 and 13 are a plan view schematically illustrating a sixth embodiment of the present invention and a sectional view taken on the line XIII—XIII in FIG. 12.
Figure 13:
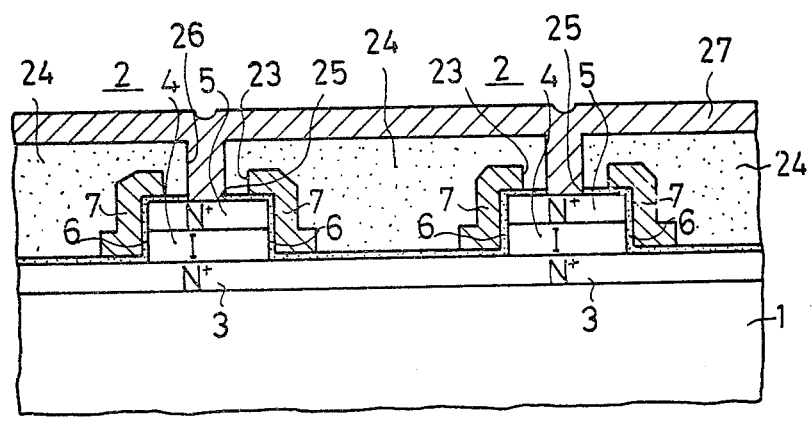

FIGS. 12 and 13 illustrate a sixth embodiment of the present invention, in which the parts corresponding to those in FIGS. 9 and 10 are identified by the same reference numerals and no detailed description will be given. According to this embodiment, in the arrangement described previously in respect of FIGS. 9 and 10, a plurality of windows 23 are formed in each conductive layer 7 to expose to the outside those areas of the insulating layer 6 where the plurality of FETs are constituted and an inter-layer insulating layer 24 is formed on the substrate 1 to cover the plurality of semicondcutor layers 3 and the plurality of pairs of the semiconductor layers 4 and 5 underlying the insulating layer 6 and the plurality of conductive layers 7. The insulating layers 6 and 24 have formed therein a plurality of pairs of windows 25 and 26 to expose therethrough to the outside each semiconductor layer 5 at those areas where the plurality of FETs are formed. Further, a plurality of strip-like conductive layers 27 are formed on the insulating layer 24. In this case, each conductive layer 27 is coupled the plurality of semiconductor layers 5 arranged in the direction of extension of each conductive layer 27 through the plurality of windows 25 and 26 arranged in the direction of its extension.

With such an arrangement, the plurality of FETs arranged in the direction of extension of each semiconductor layer 3 are interconnected at the source or drain via the semiconductor layer 3 and the plurality of FETs arranged in the direction of extension of each pair of semiconductor layers 4 and 5 are interconnected at the gate via the conductive layer 7 as in the case of the fifth embodiment. And the plurality of FETs arranged in the direction of extension of each semiconductor layer 3 are interconnected at the drain or source via the conductive layer 27. If the plurality of semiconductor layers 5 are performed to have a lower conductivity than the plurality of semiconductor layers 3, then adjacent ones of the plurality of FETs arranged in the direction of extension of each pair of semiconductor layers 4 and 5 are interconnected at the drain or source via a resistor 28 formed by an extension of the semiconductor layer 5 between the drains or sources of the adjoining FETs. In this case, the conductivity of the plurality of semiconductor layers 5 can be made lower than the conductivity of the plurality of semiconductor layers 3 by forming the latter of a semi-amorphous semiconductor and the former of an amorphous semiconductor because the semi-amorphous semiconductor is usually far higher in ionization rate than the amorphous semiconductor, and hence the latter is lower in conductivity than the former.

In the case of connecting each semiconductor layer 3 to one of the row lines XA and each conductive layer 7 to one of the column lines YC as in the case of the fifth embodiment, connecting each conductive layer 7 to one of the row lines XC, connecting via a load across a required bias power source across a selected one of the row lines XA and one row line XC forming a counterpart thereto, and connecting a control power source across the selected row line XA and a selected one of the column lines YC, even if adjacent ones of the plurality of FETs which are connected at the gate to the selected colum line YC are interconnected at the drain or source vice the semiconductor layer 5, since the registor 28 is inserted in the connection path, it is possible to obtain such a function that only the FET 2 at the intersection of the selected row lines XA and XC with the selected column line YC can be selectively activated. Accordingly, it is possible to obtain electrical picture information from an optical input image and obtain the information as time series information as in the case of the fifth embodiment.

According to the sixth embodiment described, it is possible to obtain the abovesaid function and operational effect through a very simple structure.

Figure 15:
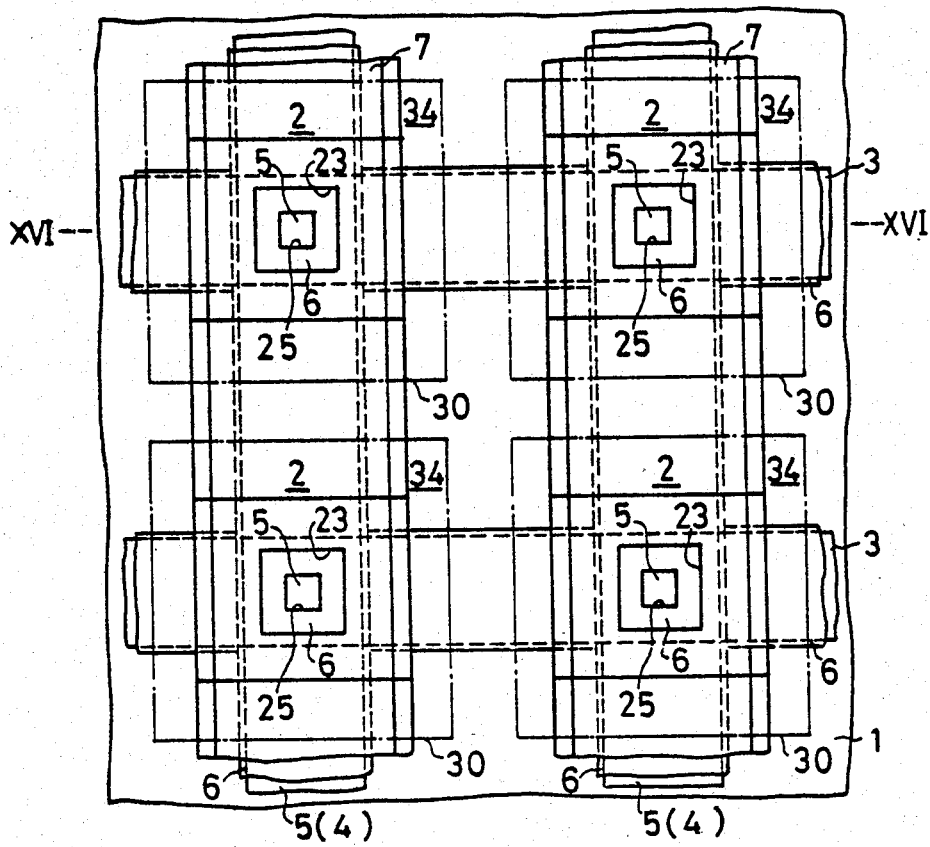
FIGS. 15 and 16 are a plan view schematically showing a seventh embodiment of the present invention and a sectional view taken on the line XVI—XVI in FIG. 15.
Figure 16:
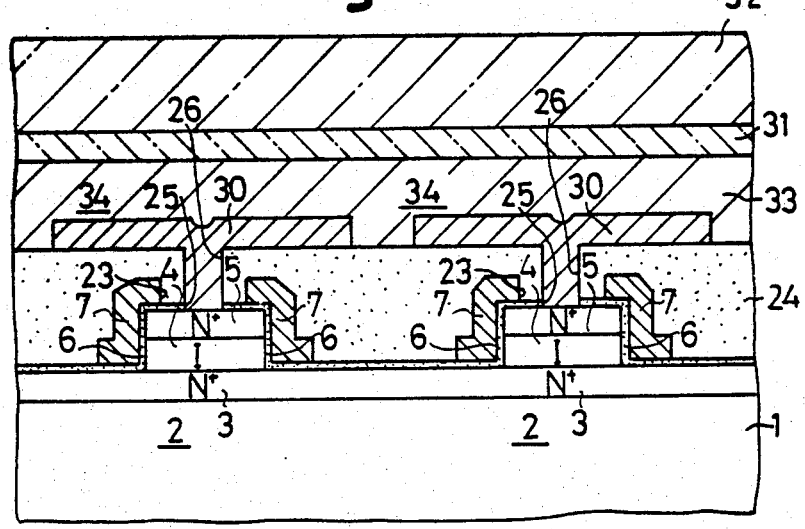

FIGS. 15 and 16 illustrate a seventh embodiment of the present invention, in which the parts corresponding to those in FIGS. 12 and 13 are identified by the same reference numerals and no detailed description will be repeated. According to this embodiment, in the arrangement described previously in connection with FIGS. 12 and 13, each conductive layer 7 extending on the insulating layer 24 is cut off at the position between adjacent ones of the plurality of FETs to form a plurality of conductive layers 30 respectively coupled with the drains or sources of the FETs. on the other hand, a light transparent substrate 32, which has a light transparent conductive layer 31 formed over the entire area of one major surface thereof and has the same shape and size as the substrate 1, is disposed above the insulating layer 24 in opposing relation thereto through proper support means (not shown), with the transparent conductive layer facing downwardly. And a liquid crystal 33 is filled between the transparent layer 31 formed on the transparent substrate 32 and the insulating layer 24 while being uniformly oriented.

With such an arrangement as described above, the sources or drains of the plurality of FETs arranged in the lengthwise direction of each semiconductor layer 3 are interconnected via the semiconductor layer 3 and the gates of the plurality of FETs arranged in the direction of extension of each pair of semiconductor layers 4 and 5 are inerconnected via the conductive layer 7.

The transparent conductive layer 31 formed on the transparent substrate 32, each conductive layer 30 opposing thereto and that portion of the liquid crystal 33 lying between the conductive layers 30 and 31 constitute one liquid crystal element 34. Each conductive layer 30 is coupled with the semiconductor layer 5 forming one of FETs 2 and, consequently, each liquid crystal element 34 is connected in series with one of the FETs 2.

Figure 17:
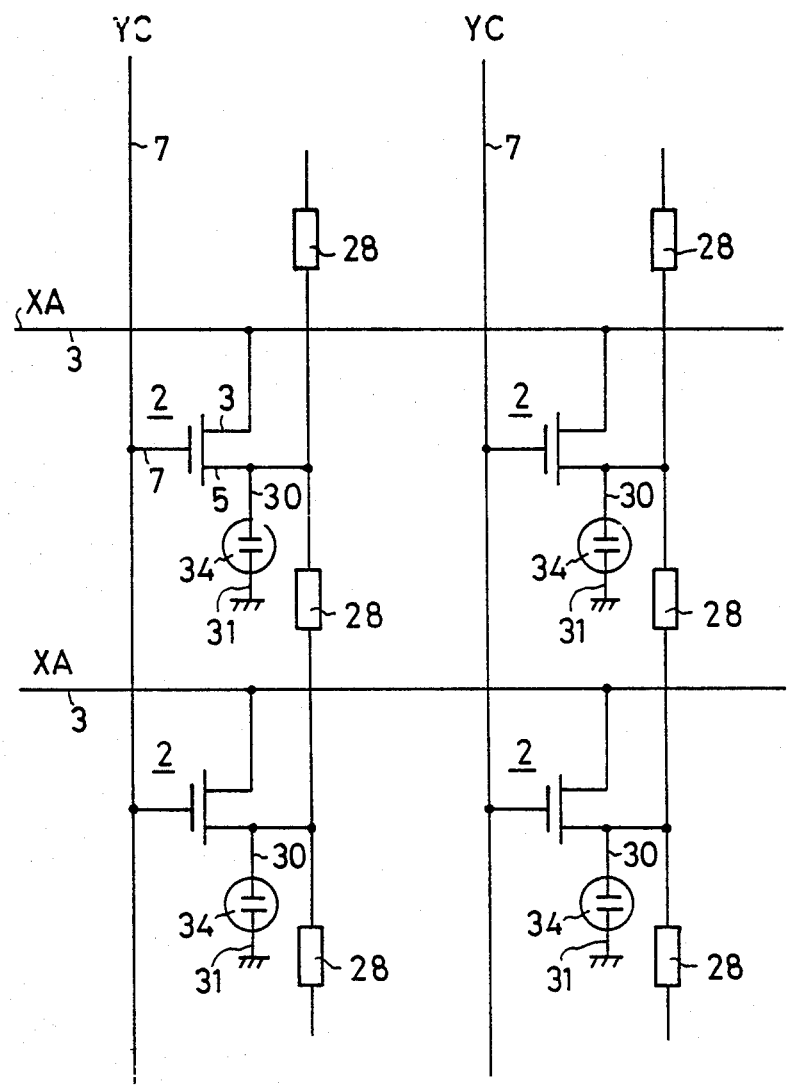
FIG. 17 is an equivalent circuit diagram of the apparatus of the seventh embodiment.

Accordingly, by grouhding the transparent conductive layer 31 associated with all the liquid crystal elements 34, the liquid crystal elements 34 are arranged in a matrix form through the FETs 2 as shown in FIG. 17.

By connecting each semiconductor layer 3 to one of the row lines XA and each conductive layer 7 to one of the column lines YC as in the case of the sixth embodiment, connecting a bias power source across a selected one of the row lines XA and the ground and connecting a control power source across a selected one of the column lines YC and the ground, only one FET 2 at the intersection of the selected row and column lines XA and YC is selectively turned ON to apply the bias power source to the liquid crystal element 34 connected to the FET 2. As a result of this, that portion of the liquid crystal 33 on the conductive layer 30 undergoes a local change in its orientation, causing a local change in the optical condition on the outside of the transparent substrate 32 and the transparent conductive layer 31. Therefore, it is possible to provide an optical picture, character or like display.

According to the seventh embodiment described above, the abovesaid function and operational effect can be obtained with such a very simple arrangement as shown in FIGS. 15 and 16.

Figure 18:
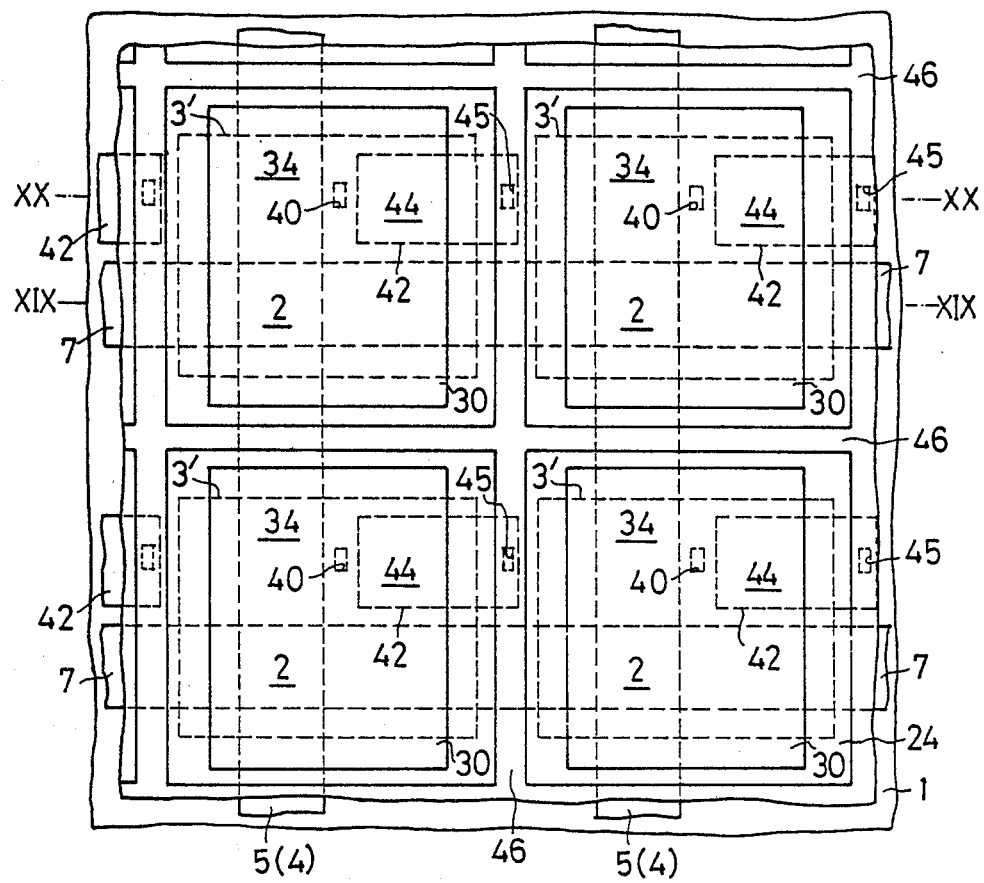
FIGS. 18, 19 and 20 are a plan view schematically showing an eighth embodiment of the present invention and sectional views taken on the lines XIX—XIX and XX—XX in FIG. 18, respedtively.
Figure 19:
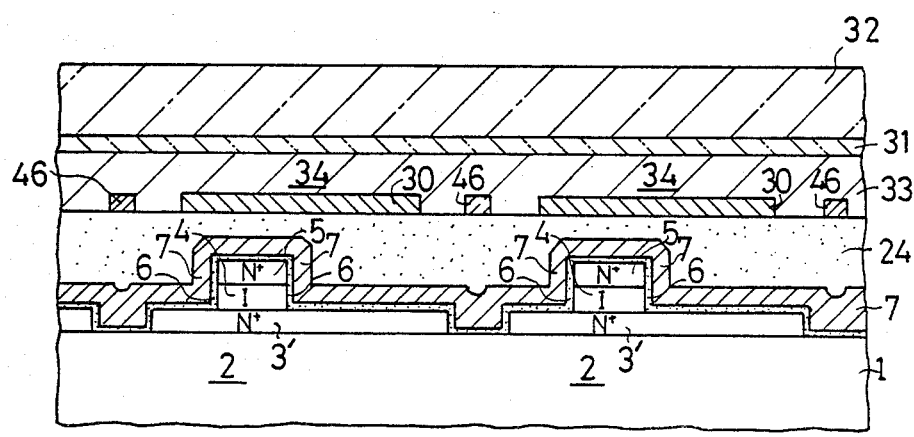
Figure 20:
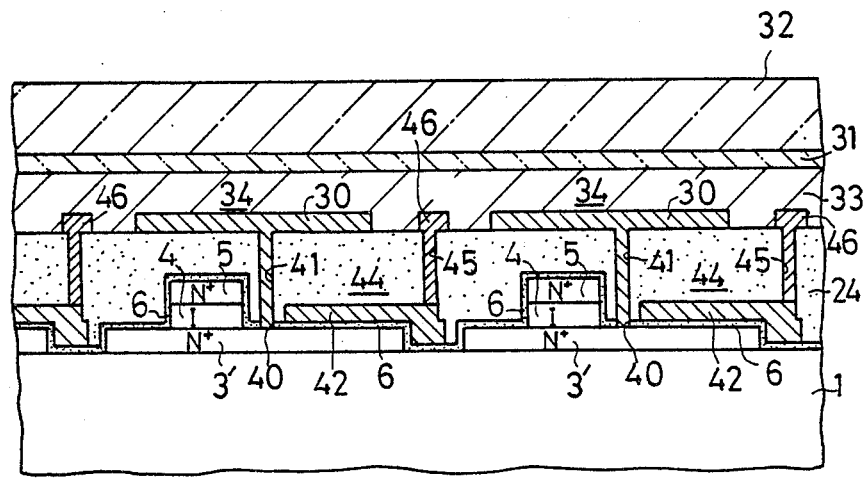

FIGS. 18, 19 and 20 illustrate an eighth embodiment of the present invention, in which the parts corresponding to those in FIGS. 5 and 6 and FIGS. 15 and 16 are identified by the same reference numerals and no detailed description will be repeated. This embodiment has the plurality of pairs of semiconductor layers 4 and 5, the plurality of conductive layers 7 and the insulating layer 6 which are employed in the embodiment of FIGS. 5 and 6. Each semiconductor layer 3 is cut off at the position between adjacent ones of the plurality of FETs 2 to form a semiconductor layer 3'.

This embodiment further has the insulating layer 24, the plurality of conductive layers 30 formed thereon, the transparent substrate 32, the transparent conductive layer 31 formed thereon and the liquid crystal 33 filled between the transparent conductive layer 31 and the insulating layer 24 as in the embodiment shown in FIGS. 15 and 16. Accordingly, this embodiment has the same liquid crystal elements 34 as those formed in the embodiment of FIGS. 15 and 16. In this case, however, the conductive layer 30 forming each liquid crystal element 34 is coupled with the semiconductor layer 3' through windows 40 and 41 formed in the insulating layers 6 and 24, respectively. Further, a conductive layer 42 is provided opposite each semiconductor layer 3' through the insulating layer 6 and a capacitance element 44 is constituted including each semiconductor layer 3', the conductive layer 42 disposed opposite thereto and the insulating layer 6 sandwiched therebetween. On the other hand, the insulating layer 24 has formed therein a window 45 to expose therethrough each conductive layer 42 and on the insulating layer 24 is formed a conductive layer 46 of a grid-like pattern which is coupled with the semiconductor layer 42 through each window 45.

The above is a description of the arrangement of the eighth embodiment. With such an arrangement, as is the case with the third embodiment described previously in respect of FIGS. 5 and 6, the plurality of FETs 2 arranged in the direction of extension of each pair of semiconductor layers 4 and 5 are interconnected at the source or drain via the semiconductor layer 5 and the plurality of FETs 2 arranged in the direction of arrangement of semiconductor layers 3 are interconnected at the gate via the conductive layer 7. Each liquid crystal element 34 is connected in series with one FET and each capacitance element 44 is also connected in series with one FET.

Figure 21:
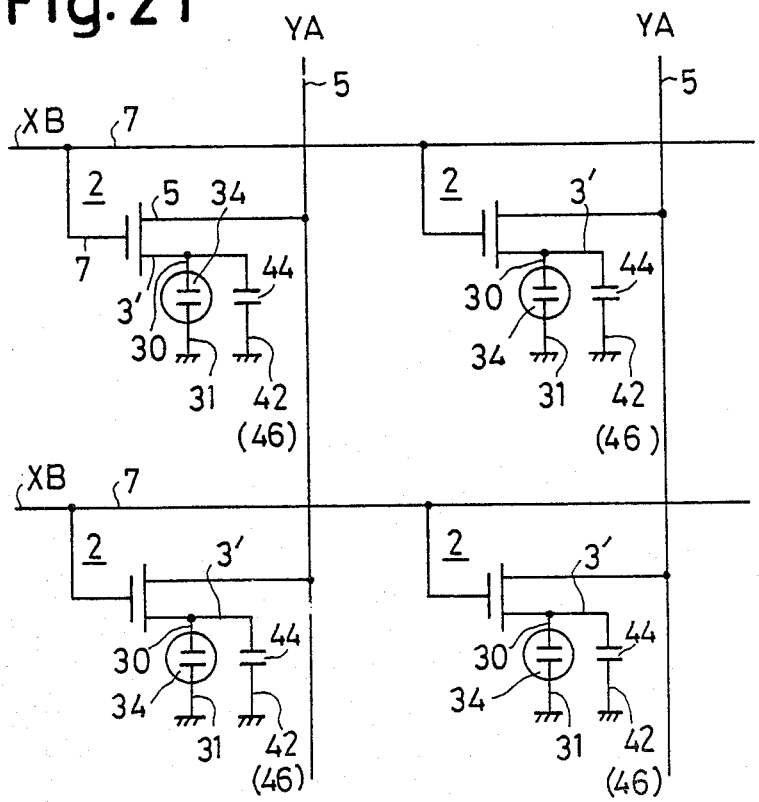
FIG. 21 is an equivalent circuit diagram of the apparatus of the eighth embodiment.

Accordingly, by grounding the transparent conductive layer 31 associated with all the liquid crystal elements 34 and the conductive layer 46 associated with all the capacitance elements 44, the liquid crystal elements 34 and the capacitance elements 44 are arranged in a matrix form through the FETs 2 as shown in FIG. 21.

By connecting each semiconductor layer 5 to one of the column lines YA and each conductive layer 7 to one of the row lines XB as in the case of the third embodiment, connecting a bias power source across a selected one of the column lines YA and the ground and connecting a control power source across a selected one of the row lines XB and the ground, only one FET 2 at the intersection of the selected column and row lines YA and XB is selectively turned ON, applying the bias power source to the liquid crystal element 34 connected to the FET 2. Consequently, it is possible to obtain an optical display of an image, character or the like. In this case, each capacitance element 44 is connected in parallel with one of the liquid crystal elements 34 and charged when the bias power source is connected to the liquid crystal element 34. Therefore, even if the bias power source is cut off after having once been connected to the liquid crystal element 34, an optical picture, character or like display can be provided for a period of time corresponding to the capacitance value of the capacitance element 44 after the bias power source was cut off.

According to the eighth embodiment of the present invention, it is possible to obtain the abovesaid function and operational effect with the very simple structure shown in FIGS. 18 to 20.

Figure 22:
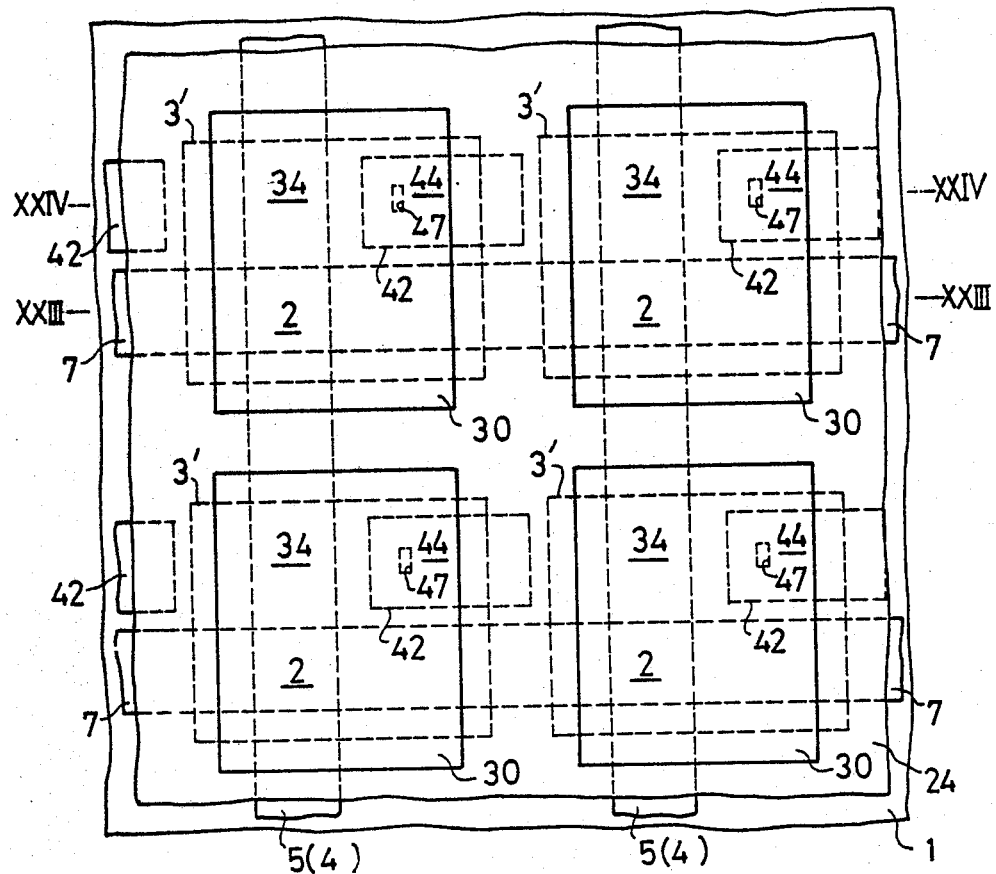
FIGS. 22, 23 and 24 are a plan view schematically illustrating a ninth embodiment of the present invention and sectional views taken on the lines XXIII—XXIII and XXIV—XXIV in FIG. 22, respectively.
Figure 23:
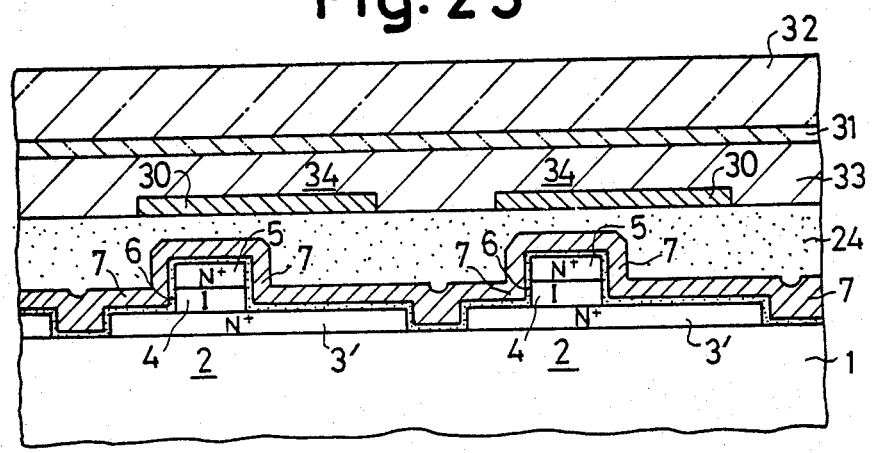
Figure 24:
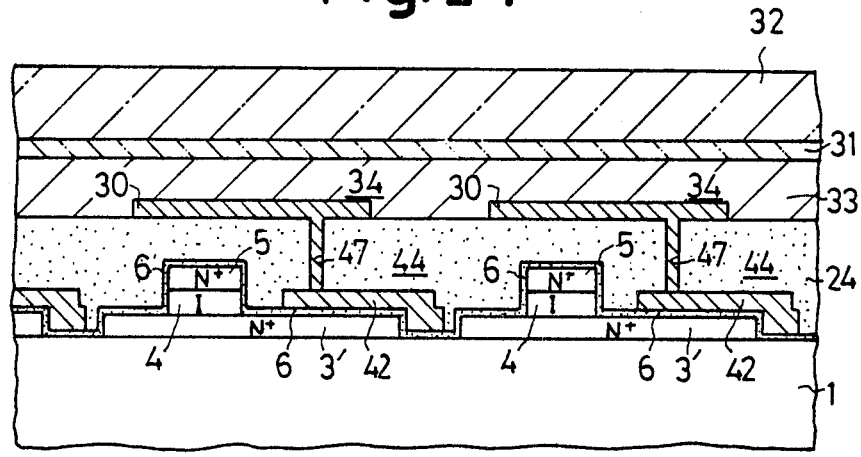

FIGS. 22, 23 and 24 illustrate a ninth embodiment of the present invention, in which the parts corresponding to those in FIGS. 18 to 20 are identified by the same reference numerals and no detailed description will be repeated. This embodiment is identical in construction with the embodiment of FIGS. 18 to 20 except that the conductive layer 30 forming each liquid crystal element 34 is not connected to the semiconductor layer 3' of each FET 2 but connected through a window 47 of the insulating layer 24 to the conductive layer 42 forming each capacitance element 44 and that the conductive layer 46 is omitted accordingly.

Figure 25:
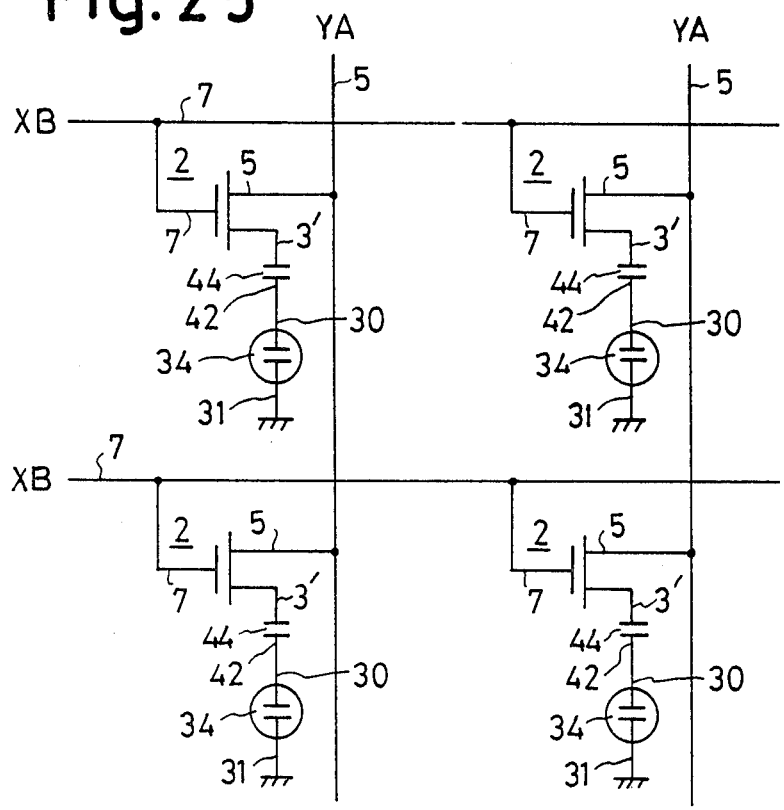
FIG. 25 is an equivalent circuit diagram of the apparatus of the ninth embodiment.

With such an arrangement, a number of series circuits of the liquid crystal element 34, the capacitance element 44 and the FET 2 are arranged in a matrix form as shown in FIG. 25, by which it is possible to produce an optical picture, character or like display as in the case of the eighth embodiment, though not described in detail. In this ninth embodiment, however, as the capacitance element 44 is connected in series with the liquid crystal element 34, the bias power source voltage is applied to the latter after being voltage divided.

According to the ninth embodiment, the abovesaid function and operational effect can be obtained with such an extremely simple arrangement as shown in FIGS. 22 to 24.

Figure 26:
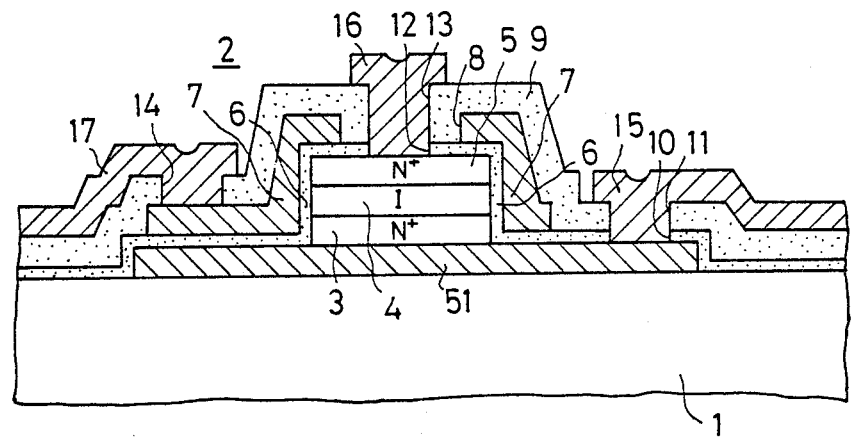
FIGS. 26 and 27 are sectional views schematically illustrating tenth and eleventh embodiments of the present invention, respectively.
Figure 27:
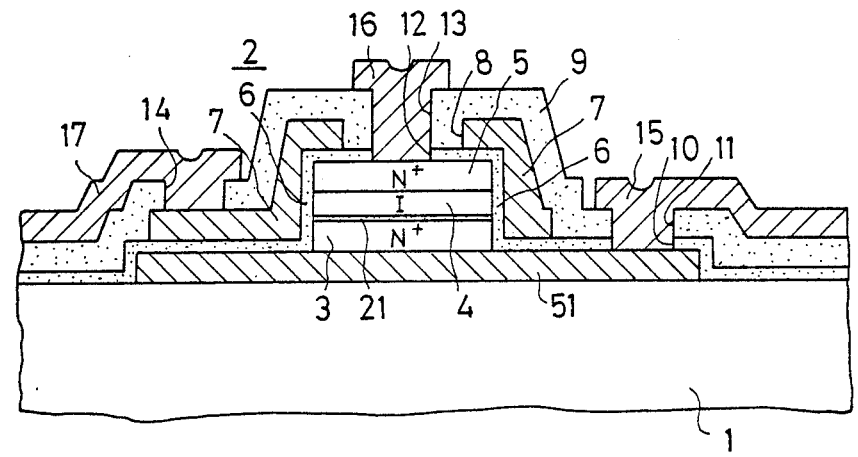

FIGS. 26 and 27 illustrate tenth and eleventh embodiments of the present invention, respectively, in which the parts corresponding to those in FIGS. 1 and 2 and in FIG. 3 are identified by the same reference numerals. The tenth and eleventh embodiments are identical in construction with the embodiments of FIGS. 1 and 2 and FIG. 3, respectively, except that the semiconductor layer 3 is replaced with a conductive layer 51 and sandwiched between the conductive layer 51 and the semiconductor layer 4 in such a pattern as to exactly underlie it.

With such arrangements as mentioned above, the tenth and eleventh embodiments have the same features as those of the first and second embodiments, respectively, though not described in detail.

Figure 28:
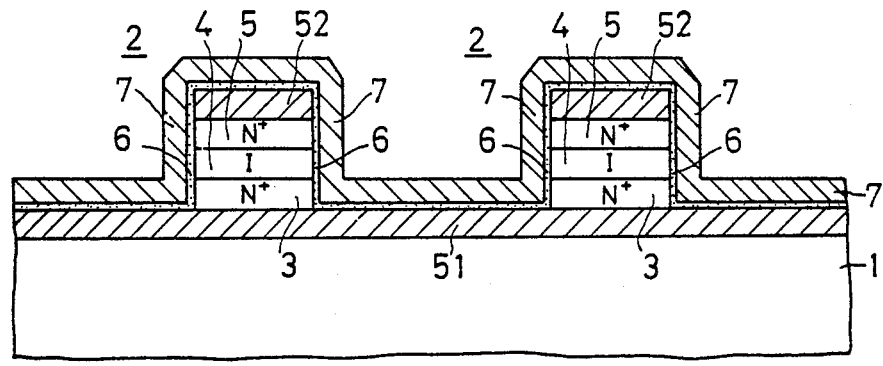
FIGS. 28 and 29 are a sectional view schematically showing a twelfth embodiment of the present invention and its equivalent circuit diagram.
Figure 30:
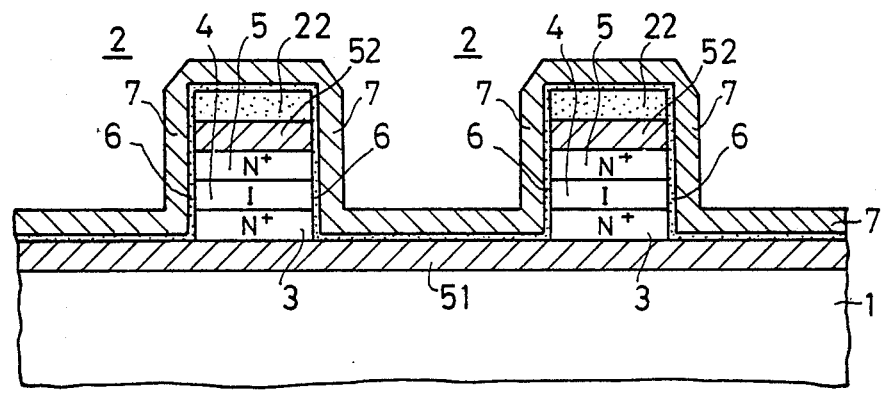
FIG. 30 is a sectional diagram schematically showing a thirteenth embodiment of the present invention.
Figure 31:
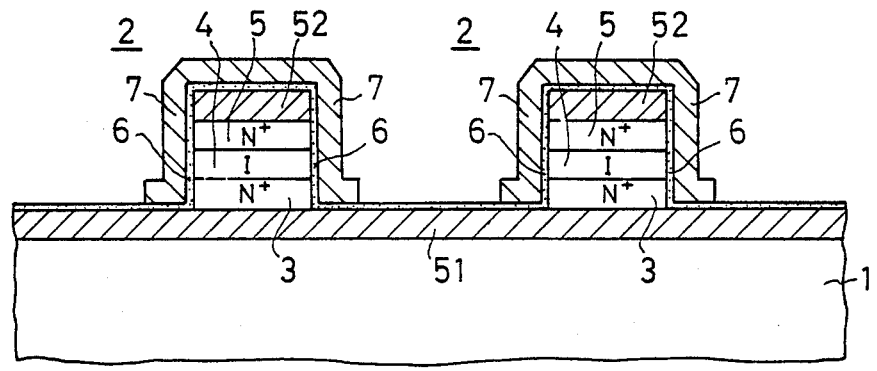
FIGS. 31 and 32 are a sectional view schematically illustrating a fourteenth embodiment of the present invention and its equivalent circuit diagram.

FIGS. 28, 30 and 31 illustrate twelfth, thirteenth and fourteenth embodiments of the present invention, respectively, in which the parts corresponding to those in FIGS. 5 and 6, 8 and 9 and 10 are identified by the same reference numerals and no detailed description will be repeated. These embodiments are identical in construction with the embodiments of FIGS. 5 and 6, 8 and 9 and 10, respectively, except that each semiconductor layer 3 is replaced with the conductive layer 51 as is the case with the tenth and eleventh embodiments of FIGS. 26 and 27, that the semiconductor layer 3 exactly underlying the semiconductor layer 4 extends across the plurality of conductive layers 51, and that a conductive layer 52 exactly overlies each semiconductor layer 5 in direct contact therewith.

With such arrangements as mentioned above, the twelfth, thirteenth and fourteenth embodiments possess the same features as the aforementioned third, fourth and fifth embodiments, respectively.

In the twelfth embodiment shown in FIG. 28, however, the plurality of FETs arranged in the direction of extension of each conductive layer 51 are interconnected at the source or drain via the conductive layer 51, the plurality of FETs arranged in the direction of extension of each conductive layer 52 are interconnected at the drain or source via the conductive layer 52 and the plurality of FETs arranged in the direction of extension of each conductive layer 51 are interconnected at the gate via the conductive layer 7. The semiconductor layers 3 and 5 are lower in conductivity than the conductive layers 51 and 52. Since the amorphous semiconductor is usually far lower in conductivity than the semi-amorphous semiconductor as described previously in respect of the sixth embodiment of FIGS. 12 and 13, the conductivity of the semiconductor layers 3 and 5 can be lowered by forming them using the amorphous semiconductor. Therefore, adjacent ones of the plurality of FETs arranged in the direction of extension of each conductive layer 52 are interconnected at the drain or source across the resistor 28 formed by that portion of the semiconductor layer 5 which is sandwiched between the drains or sources of the adjacent FETs as in the case of the sixth embodiment. Also adjacent ones of the plurality of FETs arranged in the direction of extension of each conductive layer 52 are interconnected at the source or drain across a resistor 53 formed by that portion of the semiconductor layer 3 which is sandwiched between the sources or drains of the adjacent FETs. Accordingly, a large number of FETs 2 are arranged in a matrix form as shown in FIG. 29.

In the twelfth embodiment shown in FIG. 28, by connecting each conductive layer 7 to one of the row lines XB, each conductive layer 51 to one of row lines XD and each conductive layer 52 to one of column lines YD and selecting a pair of one of the row lines XB and the corresponding one of the row lines XD and one of the column lines YD as in the case of the third embodiment of FIGS. 5 and 6, it is possible to obtain such a function that only one FET 2 at the intersection of the pair of selected row lines XB and XD with the selected column line YD is selectively activated.

Figure 29:
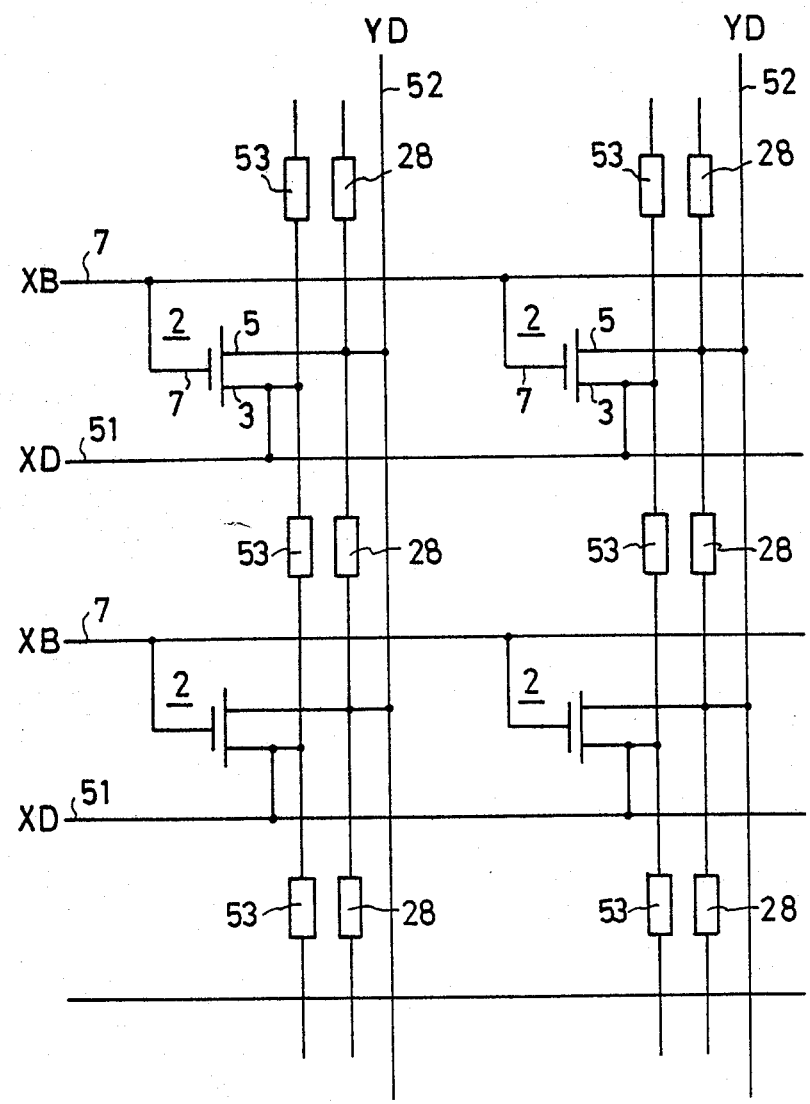

Since the thirteenth embodiment depicted in FIG. 30 is identical in construction with the twelfth embodiment of FIG. 28 except the provision of the insulating layer 22, a number of FETs 2 are arranged in a matrix form as shown in FIG. 29 as is the case with the twelfth embodiment, although no detailed description will be given. And with this embodiment, it is possible to obtain the same function as that of the twelfth embodiment.

Figure 32:
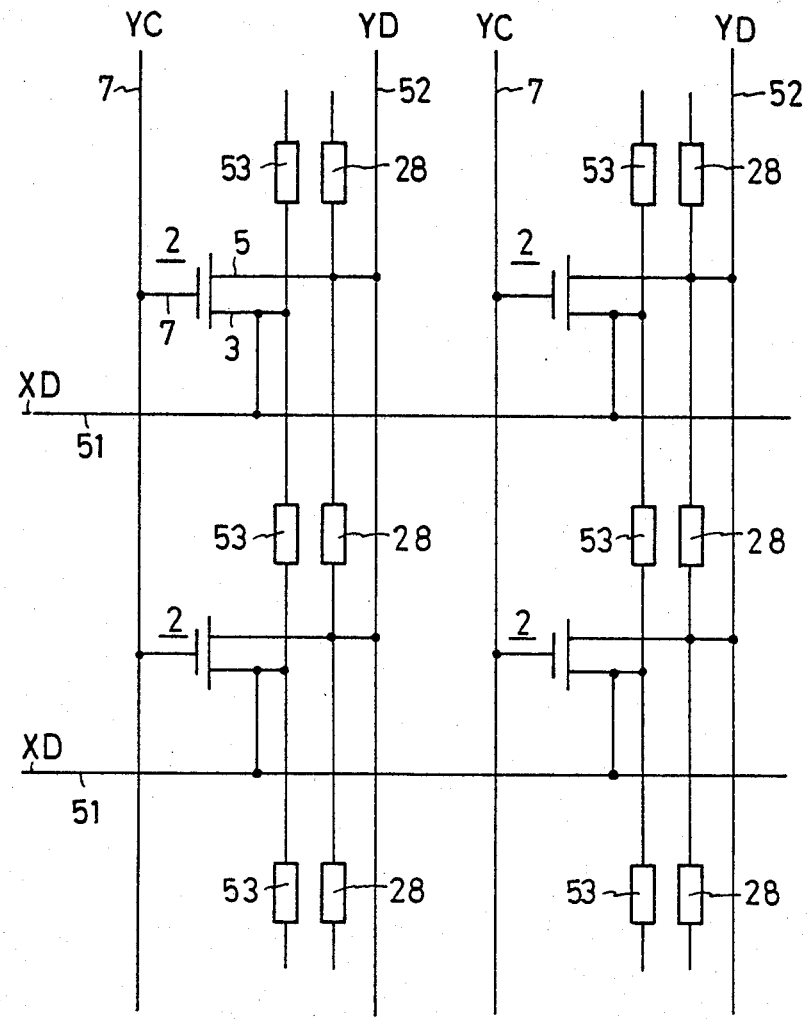

In the fourteenth embodiment illustrated in FIG. 31, the plurality of FETs arranged in the direction of extension of each conductive layer 51 and 7 are interconnected at the source or drain and gate via the conductive layers 51 and 7, respectively, and the plurality of FETs 2 arranged in the direction of extension of each conductive layer 52 are interconnected at the drain or source via the conductive layer 52. Further, adjacent ones of the plurality of FETs 2 arranged in the direction of extension of each conductive layer 52 are interconnected at either one of the source and drain and at the other via the resistors 53 and 28, respectively, as in the case of the twelfth embodiment. Accordingly, a number of FETs are arranged in a matrix form as shown in FIG. 32.

Consequently, in the fourteenth embodiment depicted in FIG. 31, by connecting each conductive layer 51 to one of the row lines XD, and each conductive layer 7 and each conductive layer 52 to one of the column lines YC and one of the column lines YD, respectively, and selecting one of the row lines XD and a pair of one of the column lines YC and a corresponding one of the column lines YD as in the case of the fifth embodiment described previously in respect of FIGS. 9 and 10, it is possible to obtain such a function that only one FET 2 at the intersection of the selected row line XD with the pair of column lines YC and YD is selectively activated.

Figure 33:
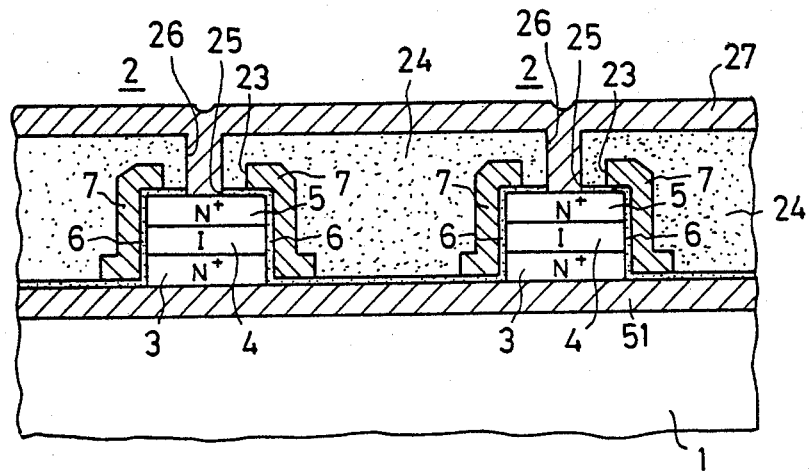
FIGS. 33 and 34 are a sectional view schematically illustrating a fifteenth embodiment of the present invention and its equivalent circuit diagram.
Figure 35:
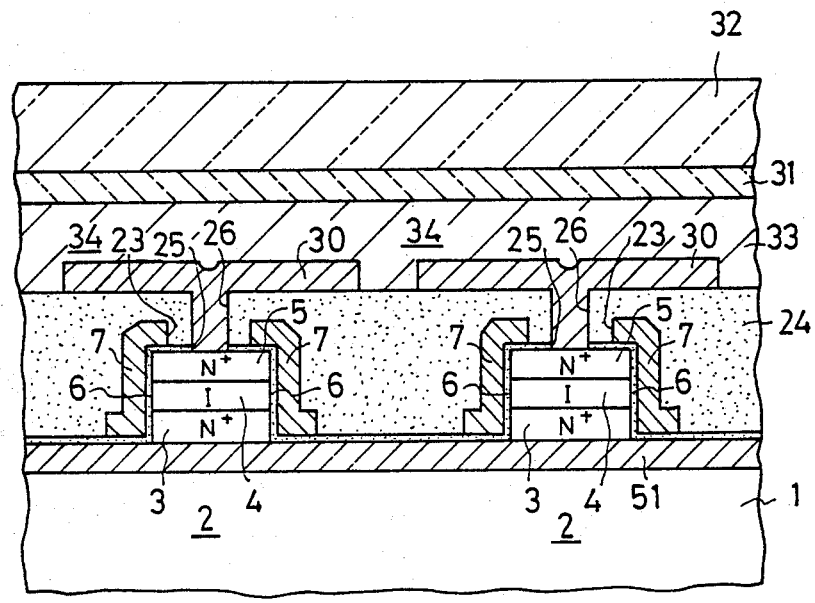
FIGS. 35 and 36 are a sectional view schematically showing a sixteenth embodiment of the present invention and its equivalent circuit diagram.

FIGS. 33 and 35 illustrate fifteenth and sixteenth embodiments of the present invention, respectively, in which the parts corresponding to those in FIGS. 12 and 13 and FIGS. 15 and 16 are identified by the same reference numerals, and no detailed description will be repeated. The fifteenth and sixteenth embodiments are identical in conjunction with the embodiments of FIGS. 12 and 13 and FIGS. 15 and 16, respectively, except that each semiconductor layer 3 is replaced with the conductive layer 51 as is the case with the tenth embodiment of FIG. 26, and that the semiconductor layer 3 exactly underlying the semiconductor layer 4 extends across the plurality of conductive layers 51.

The fifteenth and sixteenth embodiments of the above arrangements have the same features as the sixth and seventh embodiments of FIGS. 12 and 13 and and FIGS. 15 and 16, though not described in detail.

Figure 34:
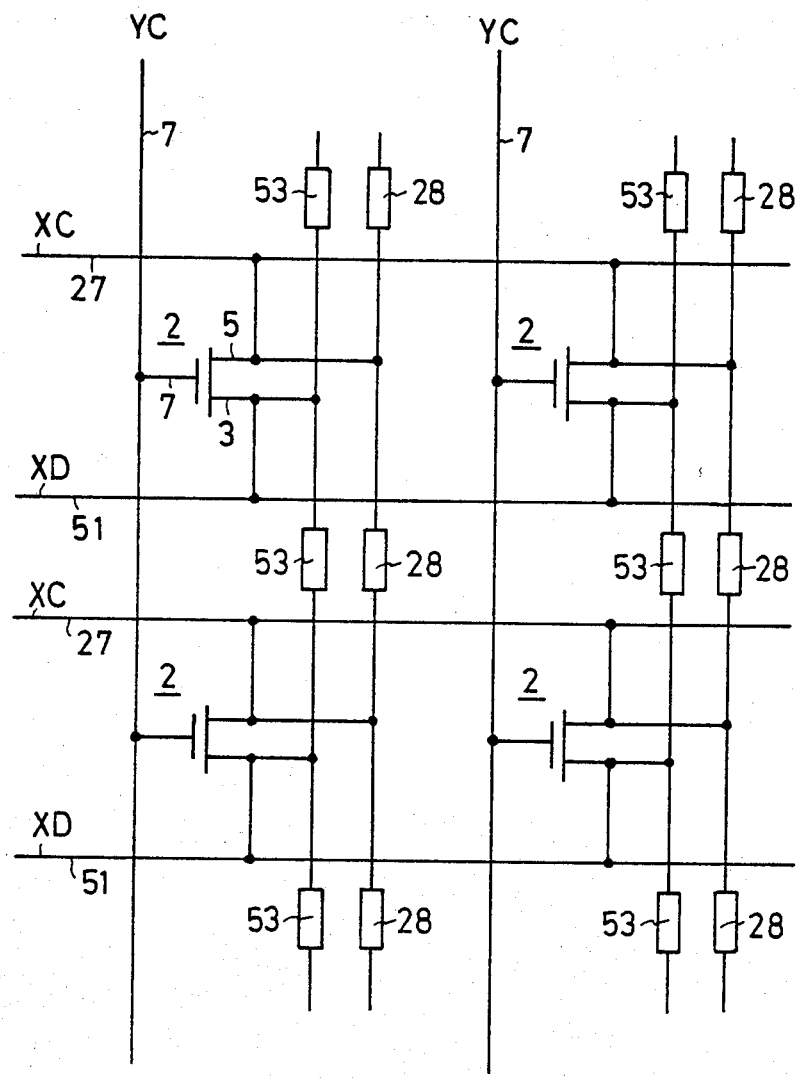

In the fifteenth embodiment of FIG. 33, however, the plurality of FETs 2 arranged in the direction of extension of each conductive layer 51 and 27 are interconnected at either one of the source and drain and at the other of them via the conductive layers 51 and 27, respectively, and the plurality of FETs 2 arranged in the direction of extension of each conductive layer 7 are interconnected at the gate via the conductive layer 7. Further, adjacent ones of the plurality of FETs 2 arranged in the direction of extension of each conductive layer 52 are interconnected at either one of the source and drain and at the other via the resistors 53 and 28, respectively, as in the case of the twelfth embodiment shown in FIG. 28. Accordingly, a number of FETs are arranged in a matrix form as shown in FIG. 34.

Figure 14:
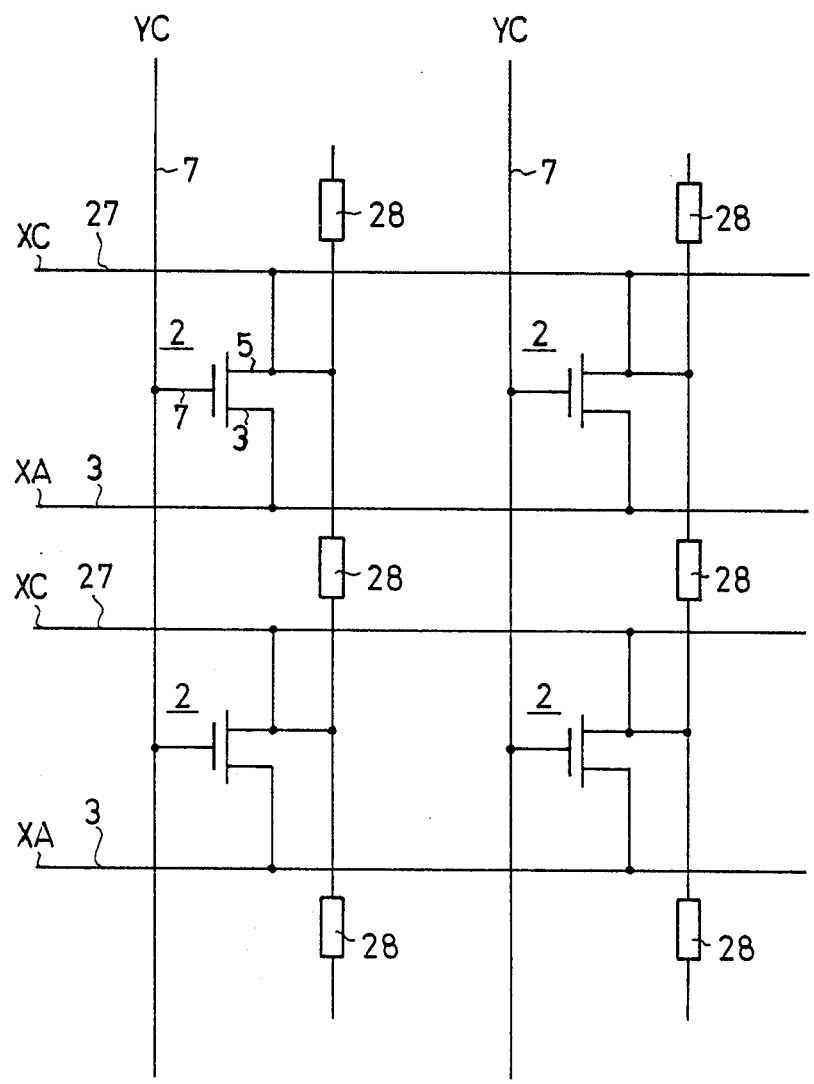
FIG. 14 is an equivalent circuit diagram of the apparatus of the sixth embodiment.

Consequently, in the fifteenth embodiment depicted in FIG. 33, by connecting each conductive layer 51 to one of the row lines XD, each conductive layer 27 to one of the row lines XC and each conductive layer 7 to one of the column lines YC and selecting a pair of the row lines XD and XC and one of the column lines YC as in the case of the sixth embodiment described previously in respect of FIGS. 12 and 14, it is possible to obtain such a function that only one FET 2 at the intersection of the selected one pair of row lines XD and XC with the selected column lines YC is selectively activated.

Figure 36:
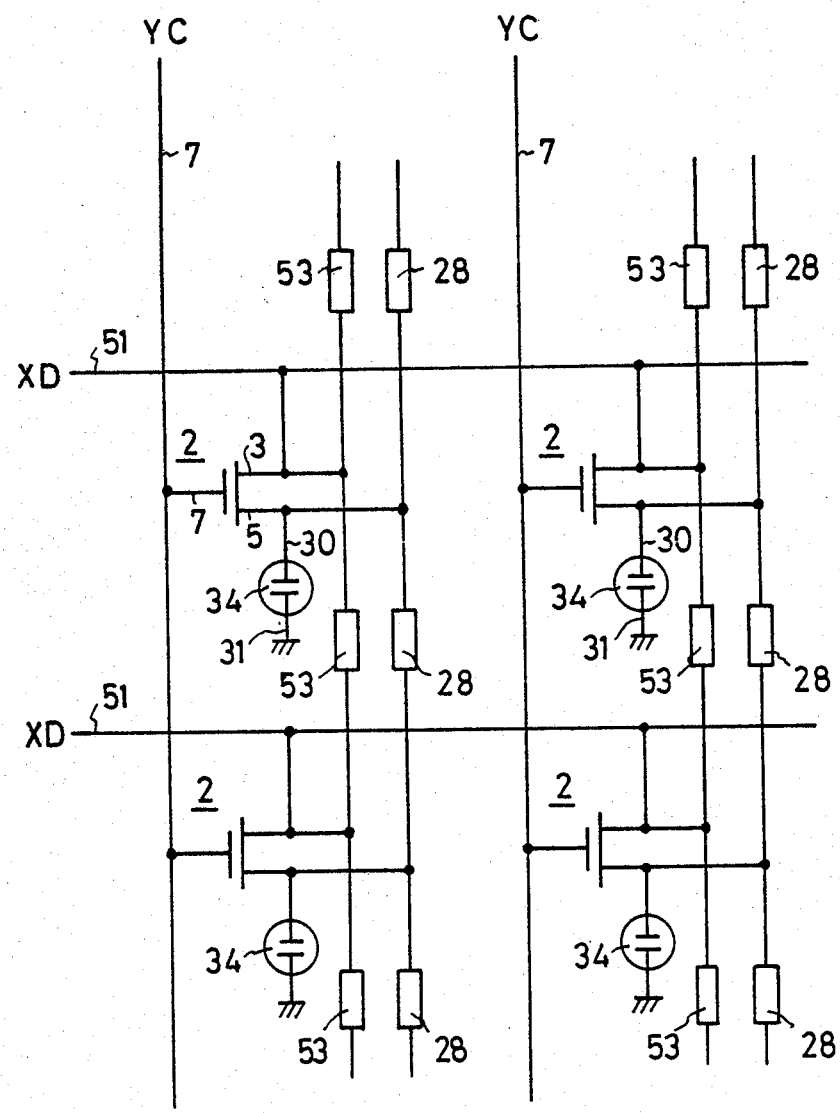
Figure 37:
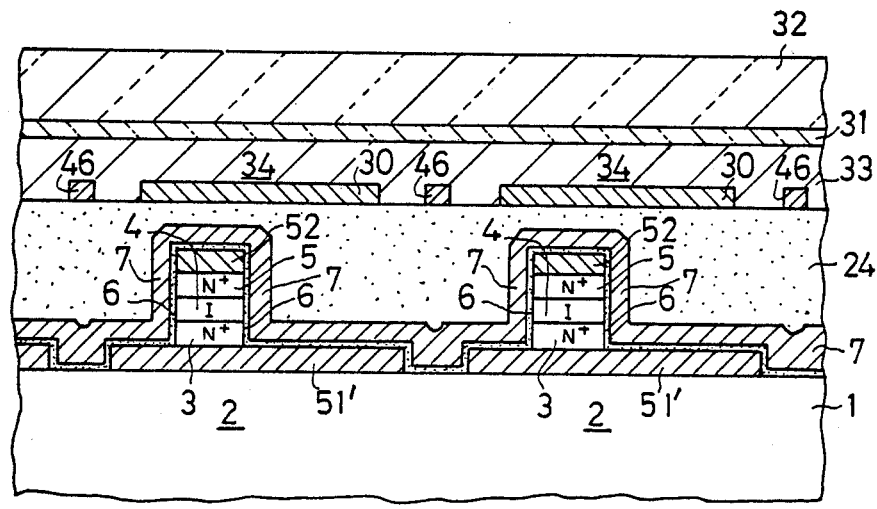
FIGS. 37 and 38 are sectional views schematically illustrating a seventeenth embodiment of the present invention.
Figure 38:
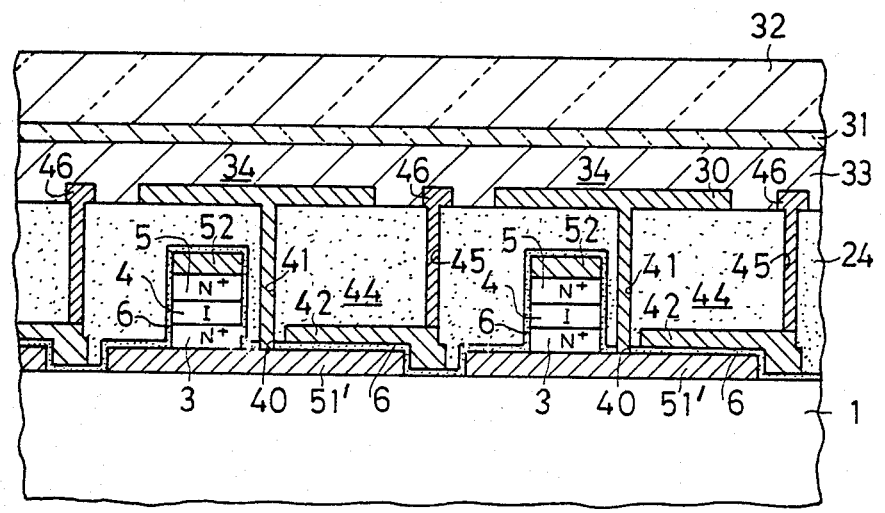

In the sixteenth embodiment of FIG. 35, however, the plurality of FETs 2 arranged in the direction of extension of each conductive layer 51 are interconnected at either one of the source and drain via the conductive layer 51, and the plurality of FETs 2 arranged in the direction of extension of each conductive layer 7 are interconnected at the gate via the conductive layer 7. Further, adjacent ones of the plurality of FETs 2 arranged in the direction of extension of each conductive layer 51 are interconnected at either one of the source and drain and at the other via the resistors 53 and 28, respectively, as in the case of the fifteenth embodiment. Accordingly, a number of series circuits of liquid crystal elements 34 and FETs are arranged in a matrix form as shown in FIG. 36.

Consequently, in the sixteenth embodiment depicted in FIG. 35, by connecting each conductive layer 51 to one of the row lines XD, and each conductive layer 7 to one of the column lines and selecting one of the row lines XD and one of the column lines YC as in the case of the seventh embodiment described previously in respect of FIGS. 15 and 16, it is possible to obtain such a function that only one series circuit of the liquid crystal element 34 and the FET 2 at the intersection of the selected row line XD with the selected column lines YC is selectively activated.

FIGS. 37 and 38 and FIGS. 40 and 41 illustrate seventeenth, and eighteenth embodiments of the present invention, respectively, in which the parts corresponding to those in FIGS. 18 to 20 and FIGS. 22 to 24 are identified by the same reference numerals and no detailed description will be repeated. These embodiments are identical in construction with the eighth and ninth embodiments of FIGS. 18 to 20 and FIGS. 22 to 24, respectively, except that each semiconductor layer 3' is replaced with a conductive layer 51', that the semiconductor layer 3 as used in the twelfth embodiment of FIG. 28 exactly underlies the semiconductor layer 4 and extends across the plurality of conductive layers 51', and that the conductive layer 52 exactly overlies each semiconductor layer 5 in direct contact therewith.

With such arrangements as mentioned above, the seventeenth and eighteenth embodiments possess the same features as the aforementioned eighth and ninth embodiments, respectively.

In the seventeenth and eighteenth embodiments shown in FIGS. 37 and 38 and FIGS. 40 and 41, however, the plurality of FETs 2 arranged in the direction of extension of each conductive layer 52 are interconnected at the drain or source via the conductive layer 52 and the plurality of FETs arranged in the direction of extension of each conductive layer 71 are interconnected at the gate via the conductive layer 7. Therefore, adjacent ones of the plurality of FETs arranged in the direction of extension of each conductive layer 52 are interconnected at either one of the drain and source and at the other of them across the resistors 28 and 53, respectively, as in the case of the sixth embodiment of FIGS. 5 and 6. Further, each capacitance element 44 is constituted by the conductive layer 51' and 42 and the insulating layer 6.

Figure 39:
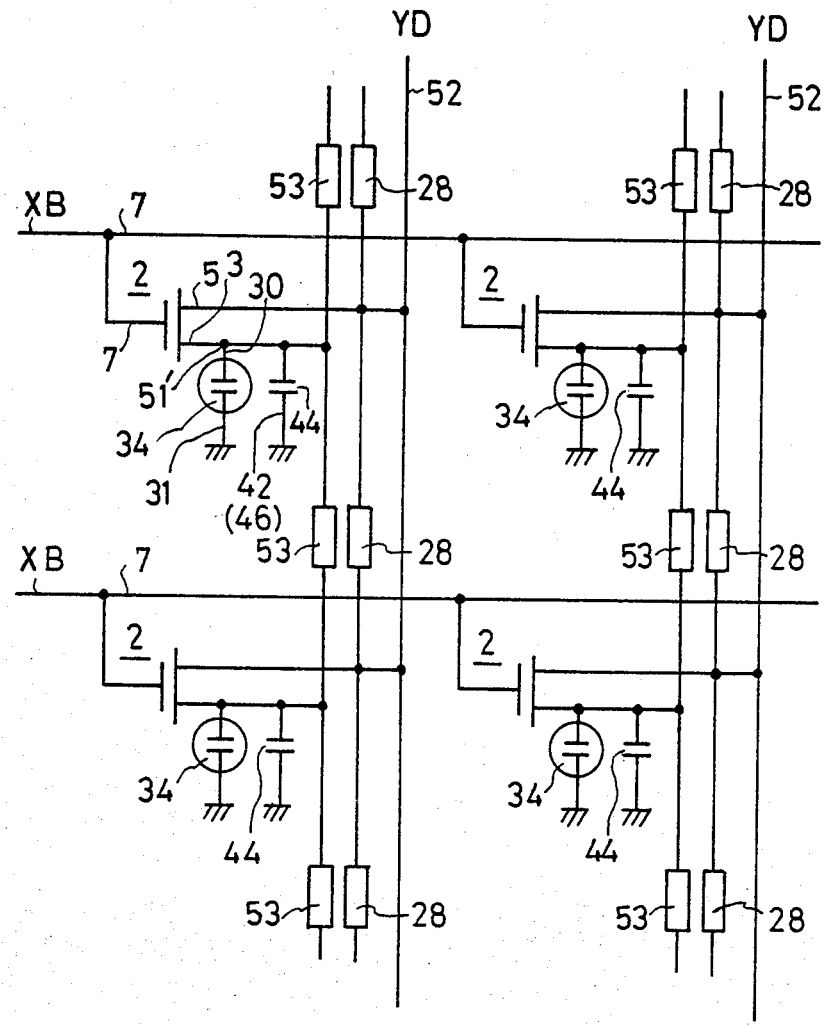
FIG. 39 is an equivalent circuit diagram of the apparatus of the seventeenth embodiment.
Figure 40:
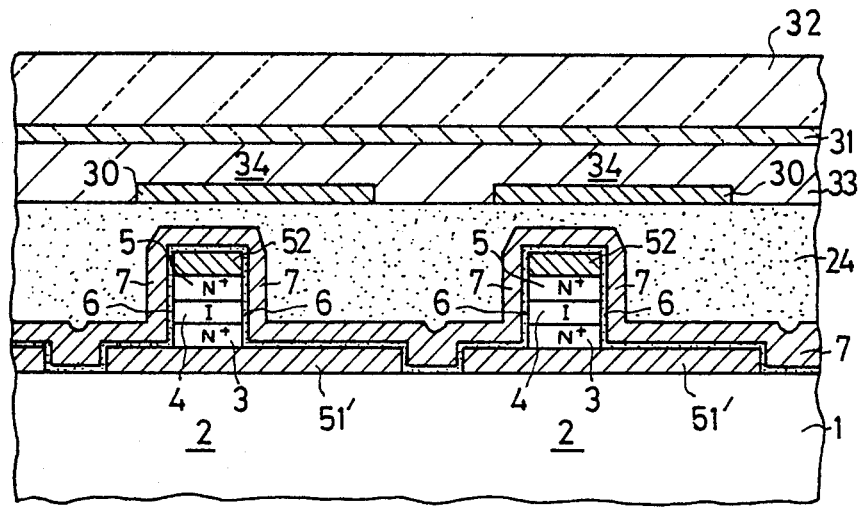
FIGS. 40 and 41 are sectional views schematically showing an eighteenth embodiment of the present invention.
Figure 41:
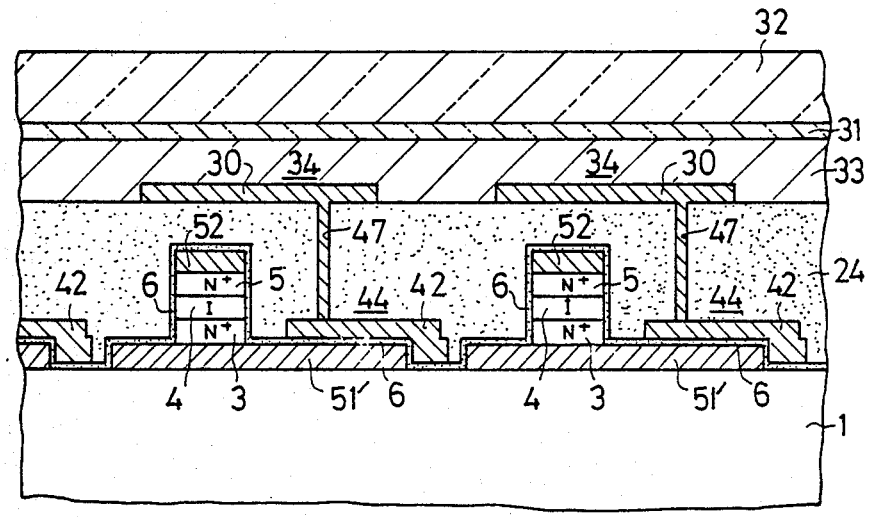
Figure 42:
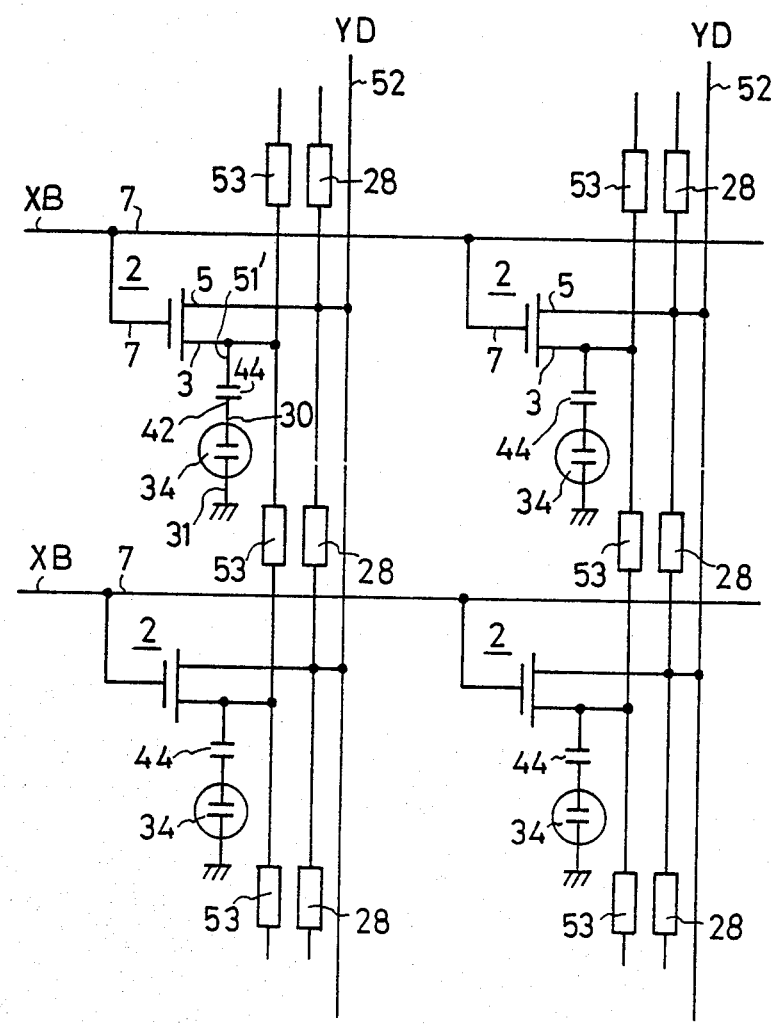
FIG. 42 is an equivalent circuit diagram of the apparatus of the eighteenth embodiment.

Accordingly, large numbers of liquid crystal elements 4, capacitance elements 44 and FETs 2 are arranged in a matrix form as shown in FIGS. 39 and 42, respectively.

In the seventeenth and eighteenth embodiments shown in FIGS. 37 and 38 and FIGS. 40 and 41, by connecting each conductive layer 7 to one of the row lines XB and each conductive layer 52 to one of the column lines YD and selecting one of the row lines XB and one of the column lines YD as in the case of the eighth and ninth embodiments of FIGS. 18 to 20 and FIGS. 22 to 24, it is possible to obtain such a function that one liquid crystal element 34, one capacitance element 44 and one FET 2 at the intersection of the selected row and column lines XB and YD is selectively activated.

The foregoing embodiments should be construed as being merely illustrative of the present invention but not in a limiting sense, and many modifications and variations may be effected as described below.

It is preferred that the semiconductor layers 3, 4 and 5 be formed of the semi-amorphous semiconductor rather than the amorphous semiconductor because the carrier mobility and diffusion length in the former are far more excellent than in the latter. In some cases, however, the amorphous semiconductor or a polycrystalline semiconductor may be used. While the semiconductor may preferably be silicon (Si), it may be Ge, InP, BP or GaAs; further, it is also possible to use silicon in combination with an additional semiconductor material compound such as is expressed by $Si_3N_{4-x}(0<x<4)$, $SiGe_{1-x}(0<x<1)$, $Si_xC_{1-x}(0<x<1)$, $Si_xSn_{1-x}(0<x<1)$ or $Si_xPb_{1-x}(0<x<1)$.

In the case where the semiconductor layers 3 and 5 are formed of the semi-amorphous semiconductor, the electron mobility is far higher than the hole mobility as compared with that when the layers 3 and 5 are formed of the single crystal semiconductor. Therefore, it is preferred that the layers 3 and 5 be N+ type, but they may also be P+ type. Furthermore, it is also possible to add nitrogen oxide or the like to the semiconductor layers 3 and 5 so as to provide abrupt junctions between them and the semiconductor layer 4 and enhance the reverse withstand voltages of the junctions. Moreover, the insulating layer 6 may preferably be formed of a silicon nitride or oxide but may also be formed of other insulating materials. Besides, it is desirable that the substrate 1 be formed of glass, but it may also be formed of various other substrate materials. It is also possible to employ a substrate having an insulating film coated on a metal plate.

It is also possible to construct each FET 2 to be either of the enhancement and depletion types.

In the eighth and ninth embodiments shown in FIGS. 18 to 20 and FIGS. 22 to 24, respectively, and the seventeenth and eighteenth embodiments shown in FIGS. 37 and 38 and FIGS. 40 and 44, respectively, the conductive layer 7 can also be formed to extend in the direction of extension of the semiconductor layers 4 and 5 as in the cases of the fifth, sixth and seventh embodiments illustrated in FIGS. 9 and 10, 12 and 13, and 15 and 16, respectively. In each of the embodiments except those shown in FIGS. 1 and 2, FIG. 3, FIGS. 12 and 13 and FIGS. 26 and 27, respectively, it is also possible to provide a conductive layer similar to that 27 as in the case of the embodiment depicted in FIGS. 12 and 13. In other embodiments than those shown in FIGS. 1 and 2, FIG. 3 and FIGS. 26 and 27, a conductive layer similar to that 27 can also be provided in the direction of extension of the semiconductor layer 3, as is the case with the embodiment of FIGS. 12 and 13. In the embodiments of FIGS. 1 and 2, FIG. 3, FIG. 26 and 27, it is also possible to provide liquid crystal elements as in the embodiments shown in FIGS. 15 and 16 and FIGS. 18 and 19. Also it is possible to replace the liquid crystal elements with capacitance elements by using insulating or dielectric layers in place of the liquid crystal.

As is the case with the second embodiment shown in FIG. 3, it is also possible in the other embodiments to interpose between the semiconductor layers 3 and 4 an insulating layer similar to that 21 which permits the passage therethrough of current. In some cases, this insulating layer may also be replaced with a semi-insulating layer or a metal layer.

Further, as is the case with the fourth embodiment shown in FIG. 8, it is also possible in the other embodiments adopting the matrix arrangement that a thick insulating layer similar to that 22 is interposed between the semiconductor layer 5 and the conductive layer 7.

It will be apparent that many modifications and variations may be effected without departing from the scope of the novel concepts of this invention.

What is claimed is:

1. Apparatus with an FET, comprising:
   a first semiconductor layer formed on a substrate;
   a second semiconductor layer formed on the first semiconductor layer;
   a third semiconductor layer formed on the second semiconductor layer;
   a first insulating layer extending on the side surface of the second semiconductor layer; and
   a first conductive layer extending on the first insulating layer in opposing relation to the side surface of the second semiconductor layer;
   wherein the first, second and third semiconductor layers are formed of a non-single crystal semiconductor doped with a dangling bond neutralizer; the first and third semiconductor layers have the same conductivity type; and the second semiconductor layer has a higher resistivity than the first and third semiconductor layers; and
   wherein the FET is constituted using the first and third semiconductor layers as either one of the drain and source and the other of them, the second semiconductor layer as channel region, the first conductive layer as a gate electrode and the first insulating layer as a gate insulating layer.

2. Apparatus with FETs, comprising:
   a plurality of strip-like first semiconductor layers formed on a substrate to extend along first lines in a first direction;
   a plurality of strip-like second semiconductor layers formed on the substrate to extend along second lines in a second direction across the plurality of first semiconductor layers;
   a plurality of strip-like third semiconductor layers, each formed on one of the second semiconductor layers to extend in the second direction;
   a plurality of first insulating layers, each formed on the side surface of one of the second semiconductor layers to extend across at least the intersections of one of the second lines with the first lines;
   a plurality of strip-like first conductive layers formed on the substrate in such a manner that each first conductive layer corresponds to one of the first lines and extends in the first direction in opposing relation to the side surfaces of the second semiconductor layers through the first insulating layers, the first conductive layer being insulated from the third semiconductor layers and the first semiconductor layer;
   wherein the first, second and third semiconductor layers are formed of a non-single crystal semiconductor doped with a dangling bond neutralizer; the first and third semiconductor layers have the same conductivity type; and the second semiconductor layers have a higher resistivity than the first and third semiconductor layers; and
   wherein the FETs are each constituted at the intersection of each first line with each second line using the first semiconductor layer as either one of the source and drain, the third semiconductor layer as the other of the source and drain, the second semiconductor layer as a channel region, the first conductive layer as a gate electrode and the insulating layer as a gate insulating layer.

3. Apparatus with FETs, comprising:
   a plurality of strip-like first semiconductor layers formed on a substrate to extend along first lines in a first direction;
   a plurality of strip-like second semiconductor layers formed on the substrate to extend along second lines in a second direction across the plurality of first semiconductor layers;
   a plurality of strip-like third semiconductor layers, each formed on one of the second semiconductor layers to extend in the second direction;

a plurality of first insulating layers, each formed on the side surface of one of the second semiconductor layers to extend across at least the intersections of one of the second lines with the first lines;

a plurality of strip-like first conductive layers formed on the substrate in such a manner that each first conductive layer corresponds to one of the second lines and extends in the second direction in opposing relation to the side surfaces of the second semiconductor layers through the first insulating layers, the first conductive layer being insulated from the third semiconductor layers and the first semiconductor layer;

wherein the first, second and third semiconductor layers are formed of a non-single crystal semiconductor doped with a dangling bond neutralizer; the first and third semiconductor layers have the same conductivity type; and the second semiconductor layers have a higher resistivity than the first and third semiconductor layers; and wherein the FETs are each constituted at the intersection of each first line with each second line using the first semiconductor layer as either one of the source and drain, the third semiconductor layer as the other of the source and drain, the second semiconductor layer as a channel region, the first conductive layer as a gate electrode and the insulating layer as a gate insulating layer.

4. Apparatus with FETs, comprising:

a plurality of first semiconductor layers formed on a substrate at a plurality of intersections of a plurality of first lines extending in a first direction with a plurality of second lines extending in a second direction intersecting the plurality of first lines;

a plurality of strip-like second semiconductor layers formed on the substrate so that each second semiconductor layer extends in the second direction across the plurality of first semiconductor layers arranged on each second line;

a plurality of strip-like third semiconductor layers, each formed on one of the second semiconductor layers to extend in the second direction;

a plurality of first insulating layers, each formed on the side surface of one of the second semiconductor layers to extend across at least the intersections of one of the second lines with the first lines;

a plurality of strip-like first conductive layers formed on the substrate in such a manner that each first conductive layer corresponds to one of the first lines and extends in the first direction in opposing relation to the side surfaces of the second semiconductor layers through the first insulating layers, the first conductive layer being insulated from the third semiconductor layers and the first semiconductor layer;

wherein the first, second and third semiconductor layers are formed of a non-single crystal semiconductor doped with a dangling bond neutralizer; the first and third semiconductor layers have the same conductivity type; and the second semiconductor layers have a higher resistivity than the first and third semiconductor layers; and wherein the FETs are each constituted at the intersection of each first line with each second line using the first semiconductor layer as either one of the source and drain, the third semiconductor layer as the other of the source and drain, the second semiconductor layer as a channel region, the first conductive layer as a gate electrode and the insulating layer as a gate insulating layer.

5. Apparatus with FETs, comprising:

a plurality of first semiconductor layers formed on a substrate at a plurality of intersections of a plurality of first lines extending in a first direction with a plurality of second lines extending in a second direction intersecting the plurality of first lines;

a plurality of strip-like second semiconductor layers formed on the substrate so that each second semiconductor layer extends in the second direction across the plurality of first semiconductor layers arranged on each second line;

a plurality of strip-like third semiconductor layers, each formed on one of the second semiconductor layers to extend in the second direction;

a plurality of first insulating layers, each formed on the side surface of one of the second semiconductor layers to extend across at least the intersections of one of the second lines with the first lines;

a plurality of strip-like first conductive layers formed on the substrate in such a manner that each first conductive layer corresponds to one of the second lines and extends in the second direction in opposing relation to the side surfaces of the second semiconductor layers through the first insulating layers, the first conductive layer being insulated from the third semiconductor layers and the first semiconductor layer;

wherein the first, second and third semiconductor layers are formed of a non-single crystal semiconductor doped with a dangling bond neutralizer; the first and third semiconductor layers have the same conductivity type; and the second semiconductor layers have a higher resistivity than the first and third semiconductor layers; and wherein the FETs are each constituted at the intersection of each first line with each second line using the first semiconductor layer as either one of the source and drain, the third semiconductor layer as the other of the source and drain, the second semiconductor layer as a channel region, the first conductive layer as a gate electrode and the insulating layer as a gate insulating layer.

6. Apparatus with an FET, comprising:

a second conductive layer formed on a substrate;

a first semiconductor layer formed on the second conductive layer;

a second semiconductor layer formed on the first semiconductor layer;

a third semiconductor layer formed on the second semiconductor layer;

a first insulating layer extending on the side surface of the second semiconductor layer; and a first conductive layer extending on the first insulating layer in opposing relation to the side surface of the second semiconductor layer;

wherein the first, second and third semiconductor layers are formed of a non-single crystal semiconductor doped with a dangling bond neutralizer; the first and third semiconductor layers have the same conductivity type; and the second semiconductor layer has a higher resistivity than the first and third semiconductor layers; and wherein the FET is constituted using the first and third semiconductor layers as either one of the drain and source and the other of them, the second semiconductor layer as channel region, the first conductive layer as a gate electrode and the first insulating layer as a gate insulating layer.

7. Apparatus with FETs, comprising:
a plurality of strip-like second conductive layers formed on a substrate to extend along first lines in a first direction;
a plurality of strip-like first semiconductor layers formed on the substrate to extend along second lines in a second direction across the plurality of second conductive layers;
a plurality of strip-like second semiconductor layers, each formed on one of the first semiconductor layers to extend in the second direction;
a plurality of strip-like third semiconductor layers, each formed on one of the second semiconductor layers to extend in the second direction;
a plurality of first insulating layers, each formed on the side surface of one of the second semiconductor layers to extend across at least the intersections of one of the second lines with the first lines;
a plurality of strip-like first conductive layers formed on the substrate in such a manner that each first conductive layer corresponds to one of the first lines and extends in the first direction in opposing relation to the side surfaces of the second semiconductor layers through the first insulating layers, the first conductive layer being insulated from the third semiconductor layers and the first semiconductor layer;
wherein the first, second and third semiconductor layers are formed of a non-single crystal semiconductor doped with a dangling bond neutralizer; the first and third semiconductor layers have the same conductivity type; and the second semiconductor layers have a higher resistivity than the first and third semiconductor layers; and
wherein the FETs are each constituted at the intersection of each first line with each second line using the first semiconductor layer as either one of the source and drain, the third semiconductor layer as the other of the source and drain, the second semiconductor layer as a channel region, the first conductive layer as a gate electrode and the insulating layer as a gate insulating layer.

8. Apparatus with FETs, comprising:
a plurality of strip-like second conductive layers formed on a substrate to extend along first lines in a first direction;
a plurality of strip-like first semiconductor layers formed on the substrate to extend along second lines in a second direction across the plurality of second conductive layers;
a plurality of strip-like second semiconductor layers, each formed on one of the first semiconductor layers to extend in the second direction;
a plurality of strip-like third semiconductor layers, each formed on one of the second semiconductor layers to extend in the second direction;
a plurality of first insulating layers, each formed on the side surface of one of the second semiconductor layers to extend across at least the intersections of one of the second lines with the first lines;
a plurality of strip-like first conductive layers formed on the substrate in such a manner that each first conductive layer corresponds to one of the second lines and extends in the second direction in opposing relation to the side surfaces of the second semiconductor layers through the first insulating layers, the first conductive layer being insulated from the third semiconductor layers and the first semiconductor layer;
wherein the first, second and third semiconductor layers are formed of a non-single crystal semiconductor doped with a dangling bond neutralizer; the first and third semiconductor layers have the same conductivity type; and the second semiconductor layers have a higher resistivity than the first and third semiconductor layers; and
wherein the FETs are each constituted at the intersection of each first line with each second line using the first semiconductor layer as either one of the source and drain, the third semiconductor layer as the other of the source and drain, the second semiconductor layer as a channel region, the first conductive layer as a gate electrode and the insulating layer as a gate insulating layer.

9. Apparatus with FETs, comprising:
a plurality of second conductive layers formed on a substrate at a plurality of intersections of a plurality of first lines extending in a first direction with a plurality of second lines extending in a second direction intersecting the plurality of first lines;
a plurality of strip-like first semiconductor layers formed on the substrate so that each first semiconductor layer extends in the second direction across the plurality of second conductive layers arranged on each second line;
a plurality of strip-like second semiconductor layers, each formed on one of the first semiconductor layers to extend in the second direction;
a plurality of strip-like third semiconductor layers, each formed on one of the second semiconductor layers to extend in the second direction;
a plurality of first insulating layers, each formed on the side surface of one of the second semiconductor layers to extend across at least the intersections of one of the second lines with the first lines;
a plurality of strip-like first conductive layers formed on the substrate in such a manner that each first conductive layer corresponds to one of the first lines and extends in the first direction in opposing relation to the side surfaces of the second semiconductor layers through the first insulating layers, the first conductive layer being insulated from the third semiconductor layers and the first semiconductor layer;
wherein the first, second and third semiconductor layers are formed of a non-single crystal semiconductor doped with a dangling bond neutralizer; the first and third semiconductor layers have the same conductivity type; and the second semiconductor layers have a higher resistivity than the first and third semiconductor layers; and
wherein the FETs are each constituted at the intersection of each first line with each second line using the first semiconductor layer as either one of the source and drain, the third semiconductor layer as the other of the source and drain, the second semiconductor layer as a channel region, the first conductive layer as a gate electrode and the insulating layer as a gate insulating layer.

10. Apparatus with FETs, comprising:
a plurality of second conductive layers formed on a substrate at a plurality of intersections of a plurality of first lines extending in a first direction with a plurality of second lines extending in a second direction intersecting the plurality of first lines;

a plurality of strip-like first semiconductor layers formed on the substrate so that each first semiconductor layer extends in the second direction across the plurality of second conductive layers arranged on each second line;

a plurality of strip-like second semiconductor layers, each formed on one of the first semiconductor layers to extend in the second direction;

a plurality of strip-like third semiconductor layers, each formed on one of the second semiconductor layers to extend in the second direction;

a plurality of first insulating layers, each formed on the side surface of one of the second semiconductor layers to extend across at least the intersections of one of the second lines with the first lines;

a plurality of strip-like first conductive layers formed on the substrate in such a manner that each first conductive layer corresponds to one of the second lines and extends in the second direction in opposing relation to the side surfaces of the second semiconductor layers through the first insulating layers, the first conductive layer being insulated from the third semiconductor layers and the first semiconductor layer;

wherein the first, second and third semiconductor layers are formed of a non-single crystal semiconductor doped with a dangling bond neutralizer; the first and third semiconductor layers have the same conductivity type; and the second semiconductor layers have a higher resistivity than the first and third semiconductor layers; and wherein the FETs are each constituted at the intersection of each first line with each second line using the first semiconductor layer as either one of the source and drain, the third semiconductor layer as the other of the source and drain, the second semiconductor layer as a channel region, the first conductive layer as a gate electrode and the insulating layer as a gate insulating layer.

11. Apparatus according to any one of claims 2 to 5 and 7 to 10 further comprising a plurality of strip-like third conductive layers, each corresponding to one of the first lines and extending in the first direction to be coupled with only the plurality of third semiconductor layers at the intersections of the plurality of second lines with the first line.

12. Apparatus according to any one of claims 2 to 5 and 7 to 10 further comprising a plurality of strip-like third conductive layers, each corresponding to one of the second lines and extending in the second direction to be coupled with only the third semiconductor layer at the intersections of the second line with the plurality of the first lines.

13. Apparatus according to any one of claims 2 to 5 and 7 to 10 further comprising a plurality of strip-like fourth conductive layers, each formed on one of the third semiconductor layers to extend in the second direction.

14. Apparatus according to claim 1 further comprising a fifth conductive layer coupled with only the first or third semiconductor layer, sixth semiconductor layer confronting the fifth conductive layer; and liquid crystal filled between the fifth and sixth conductive layers; wherein a liquid crystal element is constituted including the fifth conductive layer, the sixth conductive layer and the liquid crystal.

15. Apparatus according to any one of claims 2 to 5 and 7 to 10 further comprising a plurality of fifth conductive layers, each coupled with only one of the first or third semiconductor layers at the intersection of the first line with the second line; sixth semiconductor layer confronting the plurality of fifth conductive layers; and liquid crystal filled between the fifth and sixth conductive layers; wherein a plurality of liquid crystal elements are each constituted including the fifth conductive layer, the sixth conductive layer and the liquid crystal.

16. Apparatus according to any one of claim 1 further comprising a fifth conductive layer coupled with only one of the first or third semiconductor layer, sixth semiconductor layer confronting the fifth conductive layer; and a first insulating or dielectric layer disposed between the fifth and sixth conductive layers; wherein a first capacitance element is constituted including the fifth conductive layer, the sixth conductive layer and the first insulating or dielectric layer.

17. Apparatus according to any one of claims 2 to 5 and 7 to 10 further comprising a plurality of fifth conductive layers, each coupled with only one of the first or third semiconductor layers at the intersection of the first line with the second line, sixth semiconductor layer confronting the plurality of fifth conductive layers; and a first insulating or dielectric layer disposed between the fifth and sixth conductive layers; wherein a plurality of first capacitance elements are each constituted including the fifth conductive layer, the sixth conductive layer and the first insulating or dielectric layer.

18. Apparatus according to claim 6 further comprising a fifth conductive layer coupled with only the second conductive layer, sixth semiconductor layer confronting the fifth conductive layer; and liquid crystal filled between the fifth and sixth conductive layers; wherein a liquid crystal element is constituted including the fifth conductive layer, the sixth conductive layer and the liquid crystal.

19. Apparatus according to any one of claims 7 to 10 further comprising a plurality of fifth conductive layers, each coupled with only one of the second conductive layers at the intersection of the first line with the second line; sixth semiconductor layer confronting the plurality of fifth conductive layers; and liquid crystal filled between the fifth and sixth conductive layers; wherein a plurality of liquid crystal elements are each constituted including the fifth conductive layer, the sixth conductive layer and the liquid crystal.

20. Apparatus according to claim 6 further comprising a fifth conductive layer coupled with only the second conductive layer, sixth semiconductor layer confronting the fifth conductive layer; and a first insulating or dielectric layer disposed between the fifth and sixth conductive layers; wherein a first capacitance element is constituted including the fifth conductive layer, the sixth conductive layer and the first insulating or dielectric layer.

21. Apparatus according to any one of claims 7 to 10 further comprising a plurality of fifth conductive layers, each coupled with only one of the second conductive layers at the intersection of the first line with the second line; sixth semiconductor layer confronting the plurality of fifth conductive layers; and a first insulating or dielectric layer disposed between the fifth and sixth conductive layers; wherein a plurality of first capacitance elements are each constituted including the fifth conductive layer, the sixth conductive layer and the first insulating or dielectric layer.

22. Apparatus according to claim 1 further comprising a seventh conductive layer disposed opposite the first semiconductor layer through a second insulating or dielectric layer; wherein a capacitance element is constituted including the first semiconductor layer, the seventh conductive layer and the second insulating or dielectric layer.

23. Apparatus according to any one of claims 2 to 5 further comprising a plurality of seventh conductive layers, each disposed opposite one of the first semiconductor layers through a second insulating or dielectric layer; wherein a plurality of capacitance elements are each constituted including the first semiconductor layer, the seventh conductive layer and the second insulating or dielectric layer.

24. Apparatus according to claim 6 further comprising a seventh conductive layer disposed opposite the second conductive layer through a second insulating or dielectric layer; wherein a capacitance element is constituted including the second conductive layer, the seventh conductive layer and the second insulating or dielectric layer.

25. Apparatus according to any one of claims 7 to 10 further comprising a plurality of seventh conductive layers, each disposed opposite one of the second conductive layers through a second insulating or dielectric layer; wherein a plurality of capacitance elements are each constituted including the second conductive layer, the seventh conductive layer and the second insulating or dielectric layer.

26. Apparatus according to any one of claims 2 to 5 and 7 to 10 further comprising a plurality of third insulating layers thicker than the first insulating layers, each formed on one of the third semiconductor layers at least at the intersection of the first line with the second line.

27. Apparatus according to claim 1 or 6 further comprising a current permiable insulating or semi-insulating layer formed between the first and second semiconductor layers.

28. Apparatus according to any one of claims 2 to 5 and 7 to 10 further comprising a plurality of current permiable insulating or semi-insulating layers, each formed between one of the first semiconductor layers and one of the second semiconductor layers formed on the first semiconductor layer.

* * * * *